a>
(12) United States Patent
Suzumura et al.

(10) Patent No.: US 11,493,812 B2
(45) Date of Patent: Nov. 8, 2022

(54) DISPLAY DEVICE AND SEMICONDUCTOR DEVICE

(71) Applicant: Japan Display Inc., Tokyo (JP)

(72) Inventors: Isao Suzumura, Tokyo (JP); Fumiya Kimura, Tokyo (JP); Kazuhide Mochizuki, Tokyo (JP); Hitoshi Tanaka, Tokyo (JP); Kenichi Akutsu, Tokyo (JP); Atsuko Shimada, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 17/066,493

(22) Filed: Oct. 9, 2020

(65) Prior Publication Data
US 2021/0109412 A1    Apr. 15, 2021

(30) Foreign Application Priority Data

Oct. 11, 2019    (JP) .............................. JP2019-187855

(51) Int. Cl.
*G02F 1/1362*    (2006.01)
*G02F 1/1368*    (2006.01)
*G02F 1/1343*    (2006.01)
*H01L 27/12*    (2006.01)

(52) U.S. Cl.
CPC ...... *G02F 1/136227* (2013.01); *G02F 1/1368* (2013.01); *G02F 1/136286* (2013.01); *G02F 1/13685* (2021.01); *G02F 1/134318* (2021.01); *G02F 1/134363* (2013.01); *G02F 1/136295* (2021.01); *G02F 2201/123* (2013.01); *G02F 2201/40* (2013.01); *H01L 27/1225* (2013.01)

(58) Field of Classification Search
CPC ......... G02F 1/136227; G02F 1/136286; G02F 1/1368; G02F 1/13685
See application file for complete search history.

(56) References Cited

U.S. PATENT DOCUMENTS 6,812,912 B2 * 11/2004 Miyajima ......... G02F 1/136213
349/43
2015/0041800 A1    2/2015 Miyamoto et al.
2016/0247831 A1    8/2016 Makita et al.
2019/0196281 A1 *  6/2019 Oikawa ................. H01L 27/124

FOREIGN PATENT DOCUMENTS

WO    2013/115051 A1    8/2013
WO    2015/052991 A1    4/2015

* cited by examiner

*Primary Examiner* — Dung T Nguyen
(74) *Attorney, Agent, or Firm* — Xsensus LLP

(57) ABSTRACT

According to one embodiment, a display device includes a semiconductor layer, a first insulating layer, a gate electrode, a second insulating layer and a plurality of transparent conductive layers. The transparent conductive layers include a pixel electrode, a first conductive layer and a second conductive layer. The pixel electrode is in contact with the second conductive layer. The second conductive layer is in contact with the first conductive layer. The first conductive layer is brought into contact with a second region of the semiconductor layer through a first contact hole.

3 Claims, 19 Drawing Sheets

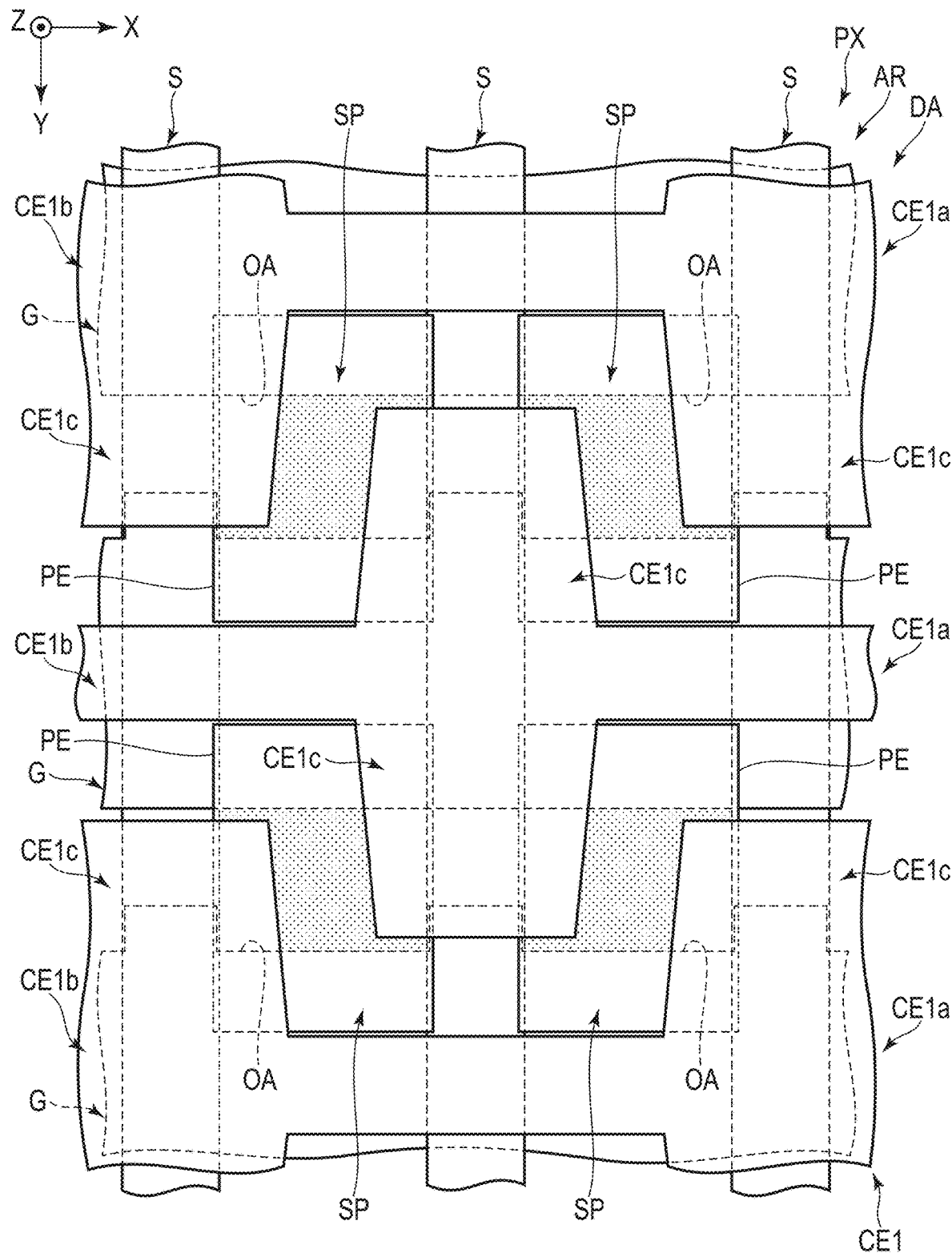
F I G. 10

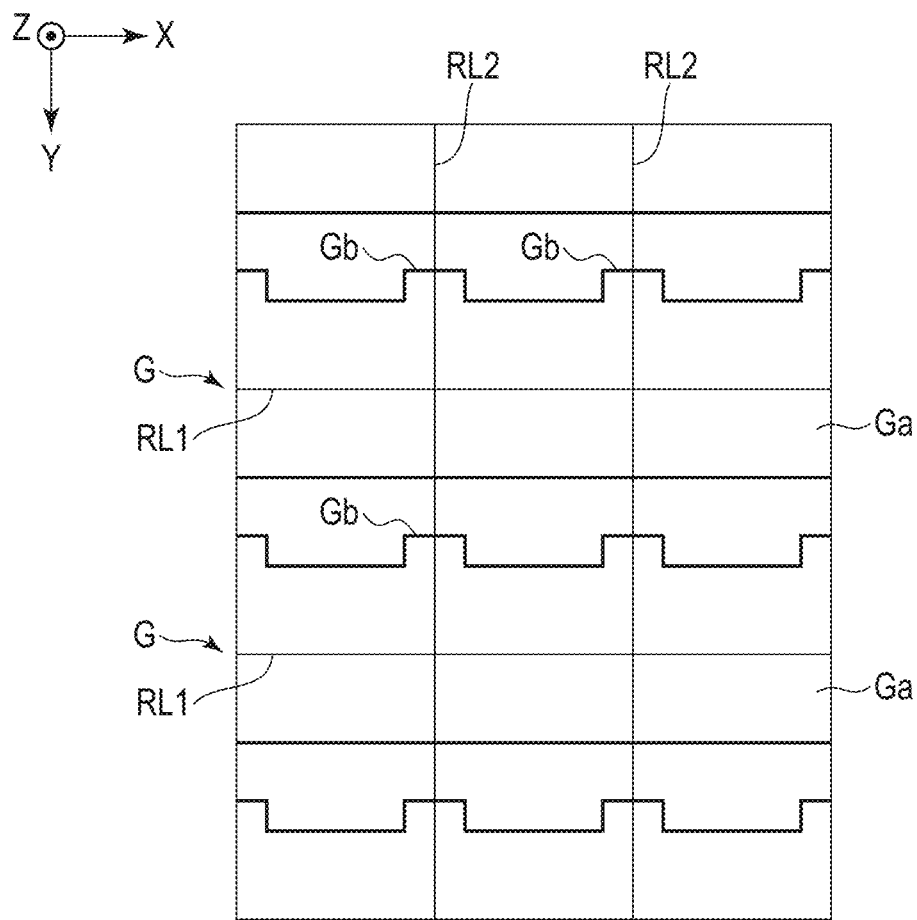
F I G. 12

DISPLAY DEVICE AND SEMICONDUCTOR DEVICE

CROSS-REFERENCE TO RELATED APPLICATIONS

This application is based upon and claims the benefit of priority from Japanese Patent Application No. 2019-187855, filed Oct. 11, 2019, the entire contents of which are incorporated herein by reference.

FIELD

Embodiments described herein relate generally to a display device and a semiconductor device.

BACKGROUND

As a display device, for example, liquid crystal display devices are known. Liquid crystal display devices have characteristics that they exhibit high brightness and can obtain high reliability. In the display devices, high definition is demanded. In order to obtain a certain level of brightness or higher, the aperture ratio needs to be improved. However, due to a problem in the layout of the wiring and the like, it is conventionally very difficult to improve the aperture ratio.

BRIEF DESCRIPTION OF THE DRAWINGS

FIG. 10 is a partially enlarged plan view showing the display area of the array substrate, also showing a plurality of gate lines, source lines, pixel electrodes and a first common electrode.

FIG. 12 is a plan view illustrating a processing step of a method of manufacturing the array substrate of the embodiment, also showing a plurality of gate lines.

DETAILED DESCRIPTION

Figure 1:
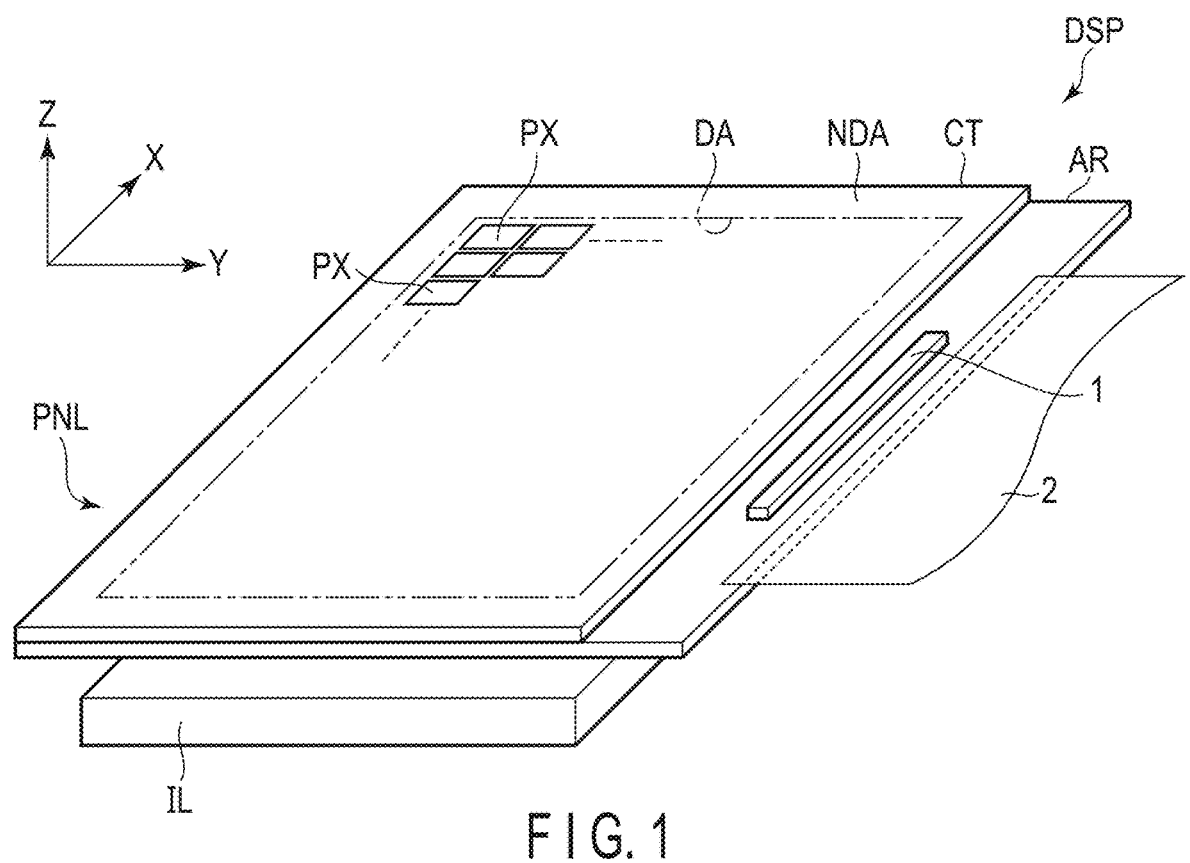
FIG. 1 is a perspective view showing a configuration of a liquid crystal display device according to an embodiment.

In general, according to one embodiment, there is provided a display device comprising a semiconductor layer including a first region, a second region and a channel region between the first region and the second region, a first insulating layer located on the semiconductor layer, a gate electrode located on the first insulating layer and opposing the channel region, a second insulating layer located on the first insulating layer and the gate electrode, and a plurality of transparent conductive layers located above the second insulating layer. The transparent conductive layers each include a pixel electrode, a first conductive layer and a second conductive layer. The pixel electrode is in contact with the second conductive layer. The second conductive layer is in contact with the first conductive layer. The first conductive layer is in contact with the second region of the semiconductor layer through a first contact hole formed in the first insulating layer and the second insulating layer.

According to another embodiment, there is provided a display device comprising a semiconductor layer including a first region, a second region and a channel region between the first region and the second region, a first insulating layer located on the semiconductor layer, a gate electrode located on the first insulating layer and opposing the channel region, a second insulating layer located on the first insulating layer and the gate electrode, and a pixel electrode located above the second insulating layer and electrically connected to the second region. The channel region is bent in a region overlapping the gate electrode.

According to still another embodiment, there is provided a semiconductor device comprising a semiconductor layer including a first region, a second region and a channel region between the first region and the second region, a first insulating layer located on the semiconductor layer, and a gate electrode located on the first insulating layer and opposing the channel region. The channel region is bent in a region overlapping the gate electrode.

Various embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

FIG. 1 is a perspective view showing a structure of a liquid crystal display device DSP according to the embodiment. Here, a first direction X and a second direction Y are orthogonal to each other, but may intersect at an angle other than 90°. A third direction Z is orthogonal to each of the first direction X and the second direction Y.

As shown in FIG. 1, the liquid crystal display device DSP comprises an active matrix liquid crystal display panel PNL, a driver 1 which drives the liquid crystal display panel PNL, an illumination device IL which illuminates the liquid crystal display panel PNL, a wiring substrate 2 and the like.

The liquid crystal display panel PNL comprises a plate-like array substrate AR and a plate-like counter-substrate CT. In this embodiment, the array substrate AR functions as a first substrate, and the counter-substrate CT functions as a second substrate. The liquid display panel PNL comprises a display area DA which displays images and a non-display area NDA provided in the region other than the display area DA. The non-display area NDA located on an outer side of the display area DA so as to surround the display area DA. The liquid display panel PNL comprises a plurality of pixels PX arrayed in a matrix in the first direction X and the second direction Y in the display area DA.

The illumination device IL is disposed on a rear surface of the array substrate AR. In this embodiment, the illumination device IL functions as a backlight unit.

The driver 1 is mounted on the array substrate AR. The wiring substrate 2 is coupled and fixed to the liquid crystal display panel PNL. For example, the driver 1 is an external circuit such as a driver IC, and the wiring substrate 2 is a flexible printed circuit (FPC). Further, the driver 1 is not limited to the example in which it is mounted on the array substrate AR, but may be configured to be mounted on the wiring substrate 2.

Figure 2:
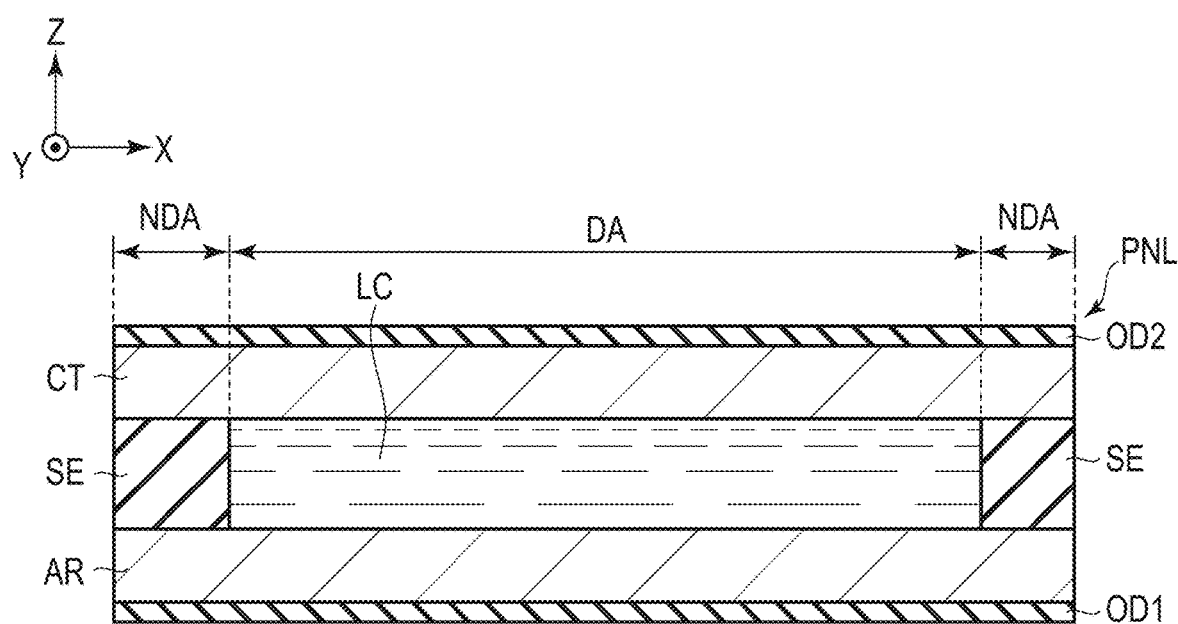
FIG. 2 is a cross section of a liquid crystal display panel shown in FIG. 1.

FIG. 2 is a cross section showing the liquid crystal display panel PNL.

As shown in FIG. 2, the counter-substrate CT is disposed to oppose the array substrate AR with a predetermined gap therebetween. The liquid crystal display panel PNL further comprises a sealing member SE, a liquid crystal layer LC, a first optical element OD1 and a second optical element OD2. The sealing member SE is disposed on the non-display area NDA so as to join the array substrate AR and the counter-substrate CT together. The liquid crystal layer LC is held between the array substrate AR and the counter-substrate CT, and thus formed in a space surrounded by the array substrate AR, the counter-substrate CT and the sealing member SE.

The first optical element OD1 is disposed on a surface of the array substrate AR, which is opposite to a surface in contact with the liquid crystal layer LC. The second optical element OD2 is disposed on a surface of the counter-substrate CT, which is opposite to a surface in contact with the liquid crystal layer LC. The first optical element OD1 and the second optical element OD2 each include at least a polarizer, and may include a retardation film as needed. An absorption axis of the polarizer included in the first optical element OD1 is orthogonal to, for example, an absorption axis of the polarizer included in the second optical element OD2.

Figure 3:
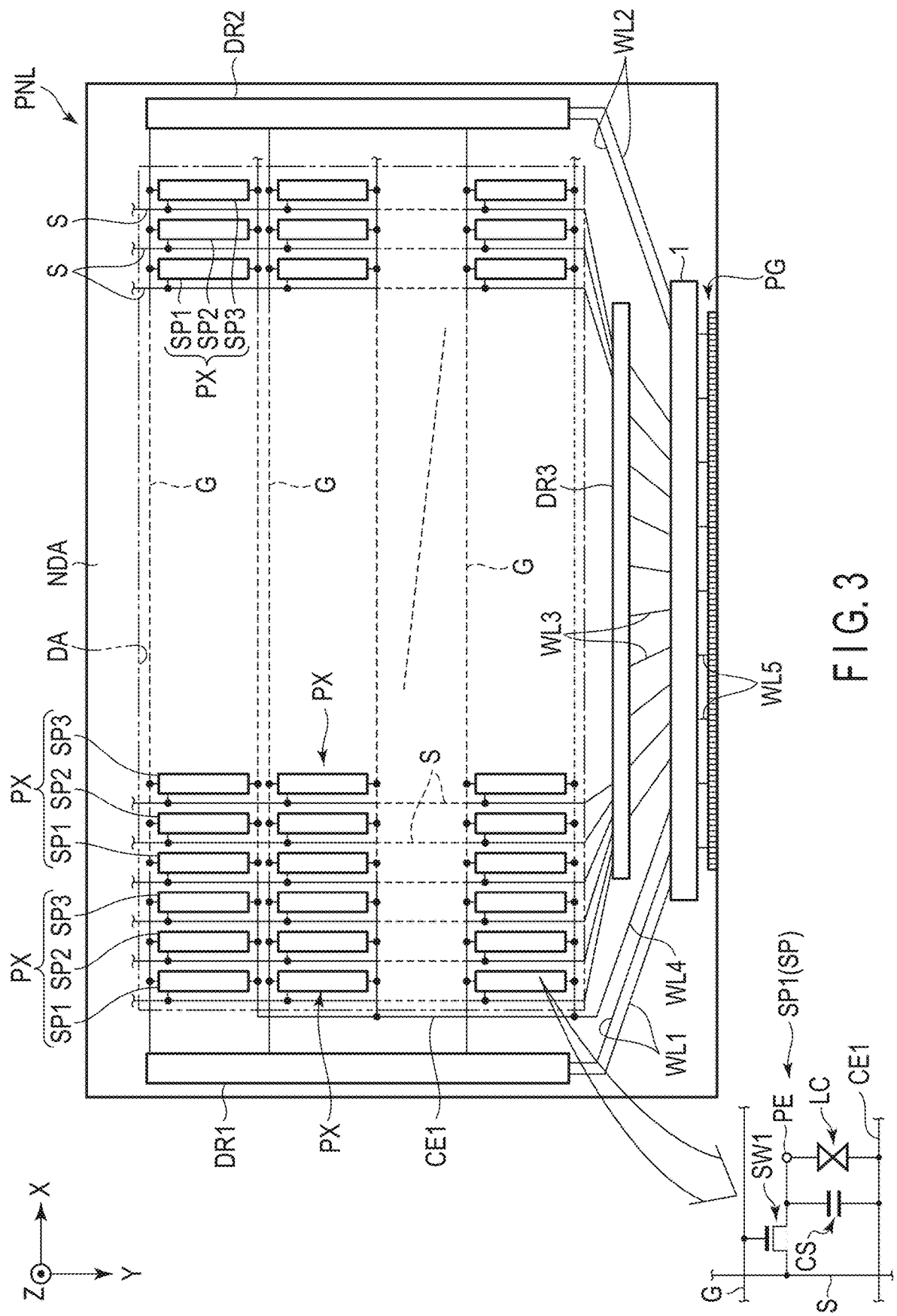
FIG. 3 is a circuit diagram of the liquid-crystal display panel and a driver shown in FIG. 1, showing along with a circuit structure of a sub-pixel.

FIG. 3 is a circuit diagram showing the liquid crystal display panel PNL and driver 1 of FIG. 1, which also shows a circuit structure of one sub-pixel SP. Note that, here, only an example of the circuit diagram of the liquid crystal display panel PNL and the driver 1 is shown, and the circuit structure of the liquid crystal display panel PNL and the driver 1 is not limited to that shown in FIG. 3.

As shown in FIG. 3, the liquid crystal display panel PNL comprises, in the display area DA, a plurality of pixels PX, a plurality of gate lines G, a plurality of source lines S and a first common electrode CE1. The pixels PX are arrayed into a matrix. Each of the pixels PX includes a first sub-pixel SP1 of first-color, a second sub-pixel SP2 of a second color and a third sub-pixel SP3 of a third color. When focusing on the sub-pixels SP, the first sub-pixel SP1, the second sub-pixel SP2 and the third sub-pixel SP3 are arranged alternately along the first direction X. Note that the first, second and third colors are naturally different from each other. In this embodiment, the first color is red, and the second color is green, and the third color is blue.

In the display area DA, the gate lines G each it extend in the first direction X and the source lines S each extend in the second direction Y. In the non-display area NDA, the liquid crystal display panel PNL includes a first driver DR1, a second driver DR2 and a third driver DR3. In this embodiment, the first driver DR1 and the second driver DR2 sandwich the display area DA therebetween along the first direction X and each function as a gate line drive circuit. The third driver DR3 functions as a select circuit. The first driver DR1, the second driver DR2 and the third driver DR3 are not external circuits such as the drive circuit 1, but are built-in circuits each comprising a switching element SW2 formed on the first insulating substrate 10, which will be described later.

Each of the gate lines G extends in the non-display area NDA and is connected to the first driver DR1 and the second driver DR2. Note that the liquid crystal display panel PNL need not necessarily to comprise both of the first driver DR1 and the second driver DR2, but it suffices if it comprise at least one of the first driver DR1 and the second driver DR2. Each of the source lines S extends in the non-display area NDA and is connected to the third driver DR3. The first common electrode CE1 is commonly shared by the pixels PX.

The first driver DR1 is electrically connected to the driver 1 via wiring lines WL1. The second driver DR2 is electrically connected to the driver 1 via wiring lines WL2. The third driver DR3 is electrically connected to the driver 1 via wiring lines WL3. The first common electrode CE1 is connected to a common electrode drive circuit in the driver 1 via a wiring line WL4. The driver 1 is electrically connected to an outer lead bonding pad group PG (that is, an OLB pad group) of the liquid crystal display panel PNL via wiring lines WL5. Note that the wiring substrate 2 shown in FIG. 1 is electrically connected to the OLB pad group PG. To the driver 1, various signals and voltages are applied via the wiring substrate 2.

Note that, apart from this embodiment, the common electrode drive circuit may be located in the non-display area NDA so as to be independent from the driver 1 and may be electrically connected to the driver 1 via the wiring. Or, the third driver DR3 may be incorporated in the driver 1 without being independent from the driver 1.

Each of the sub-pixels SP comprises a switching element SW1, a pixel electrode PE, a first common electrode CE1, a liquid crystal layer LC, and the like. The switching element SW1 is formed from, for example, a thin-film transistor (TFT) and is electrically connected to the respective gate line G and source line S. The pixel electrode PE is electrically connected to the switching element SW1. The pixel electrode PE of each of the sub-pixels SP opposes the first common electrode CE1. The liquid crystal layer LC is driven by an electric field produced between the pixel electrode PE and the first common electrode CE1. To the pixel electrode PE, a storage capacitor CS is coupled. The storage capacitor CS is formed, for example, between an electrode at the same potential as that of the first common electrode CE1 and an electrode at the same potential as that of the pixel electrode PE.

Here, a detailed explanation on the configuration of the sub-pixel SP will be omitted, but the sub-pixel SP has a configuration corresponding to the display mode which utilize a lateral electric field along the main surface of the array substrate AR. The main surface of the array substrate AR, referred to here, is a surface parallel to an X-Y plane defined by the first direction X and the second direction Y.

The pixels PX are arranged in the first direction X and the second direction Y. The source lines S are arranged in the first direction X, whereas the gate lines G are arranged in the second direction Y.

Figure 4:
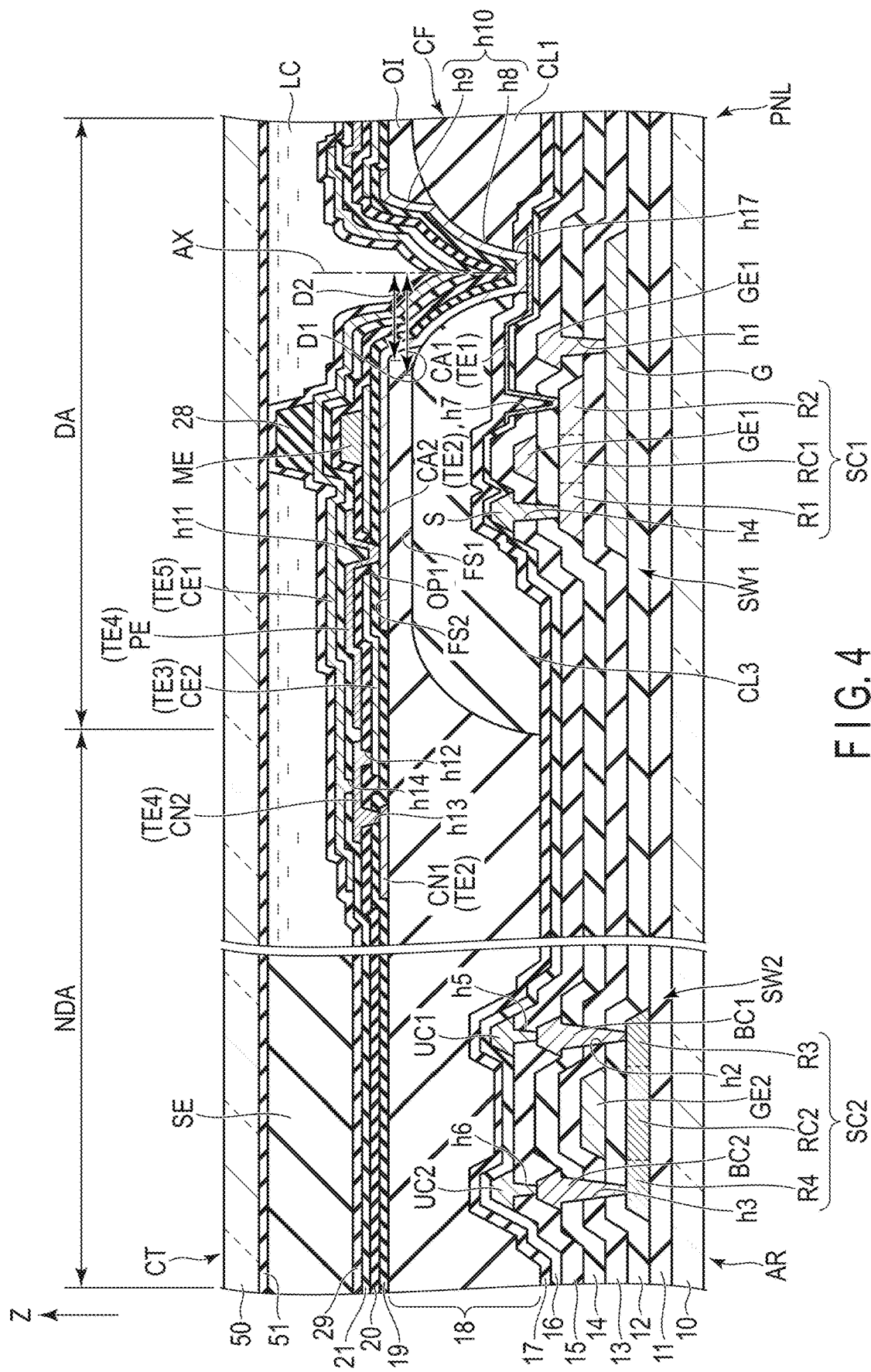
FIG. 4 is a cross section showing configurations of a display area and a non-display area of the liquid-crystal display panel.

FIG. 4 is a cross section showing configurations of the display area DA and the non-display area NDA of the liquid crystal display panel PNL. FIG. 4 is a diagram illustrating the stacking order of the third direction Z. Note that the positions between the members with relation to each other in a direction normal to the third direction Z may be different from those of the example of FIG. 4.

As shown in FIG. 4, the array substrate AR comprises a first insulating substrate 10 of a light-transmissive glass substrate, a flexible resin substrate or the like. The array substrate AR further comprises insulating layers 11 to 21, the switching element SW1, the switching element SW2, a plurality of conductive layers, a spacer 28 and an alignment film 29.

The insulating layer 11 is provided on the first insulating substrate 10. For example, the insulating layer 11 is configured as a stacked layer body comprising an insulating layer of silicon oxide (SiO) and an insulating layer of silicon nitride (SiN). The thickness of the insulating layer 11 is, for example, 500 nm or less.

A semiconductor layer SC2 is provided on the insulating layer 11 and is located in the non-display area NDA. The semiconductor layer SC2 is formed from, for example, a low-temperature polycrystalline silicon as polycrystalline silicon. The thickness of semiconductor layer SC2 is, for example, 50 nm or less. The semiconductor layer SC2 includes a third region R3, a fourth region R4 and a channel region RC2 located between the third region R3 and the fourth region R4.

The liquid crystal display device DSP is configured such that light enters the display area DA of the liquid crystal display panel PNL from the illumination device IL, but the light from the illumination device IL is not allowed to enter the non-display area NDA of the liquid crystal display panel PNL. Therefore, a light-shielding portion is not provided below the semiconductor layer SC2. But, it may be configured to provide a light-shielding portion below the semiconductor layer SC2, in which case, the light-shielding portion is formed between the insulating film 11 and the first insulating substrate 10.

The insulating layer 12 is provided on the insulating layer 11 and the semiconductor layer SC2, and covers the semiconductor layer SC2 and the like. For example, the insulating layer 12 is formed of a silicon nitride film which uses tetraethoxyaisilane (TEOS). The thickness of the insulating layer 12 is, for example, 50 to 150 nm.

The respective gate line G and the gate electrode GE2 are provided on the insulating layer 12. The gate line G is located in the display area DA. The gate electrode GE2 is located in the non-display area NDA so as to oppose the channel region RC2 of the semiconductor layer SC2. The semiconductor layer SC2, the gate electrode GE2 and the like constitute the switching element SW2, which is a TFT.

The gate line G and the gate electrode GE2 each have a two-layered structure (Ti-based/Al-based). The gate line G and the gate electrode GE2 each include a lower layer formed of, for example, a metallic material whose main component is aluminum, containing aluminum (Al) and an Al-containing alloy, and an upper layer formed of, for example, a metallic material whose main component is Ti, containing Ti and a Ti-containing alloy. The thickness of each of the gate line G and the gate electrode GE2 is, for example, 500 nm or less.

As described above, in the gate line G and the gate electrode GE2, the lower layer located on a first insulating substrate 10 side is formed from a metallic material containing Al as a main component. Thus, the lower layer can contribute to improvement of the recycle rate of the light emitted from the illumination device IL.

The insulating layer 13 is provided on the insulating layer 12, the gate line G and the gate electrode GE2 and covers the gate line G, the gate electrode GE2 and the like. For example, the insulating layer 13 is configured as a stacked layer body comprising an insulating layer formed of SiO and an insulating layer formed of SiN. The thickness of the insulating layer 13 is, for example, 1,000 nm or less.

A semiconductor layer SC1 is provided on the insulating layer 12 and is located in the display area DA. The semiconductor layer SC1 is formed of oxide semiconductor (OS), which is a transparent semiconductor. Typical examples the oxide semiconductor are indium gallium zinc oxide (InGaZnO), indium gallium oxide (InGaO), indium zinc oxide (InZnO), zinc tin oxide (ZnSnO), zinc oxide (ZnO) and transparent amorphous oxide semiconductor (TAOS). In this embodiment, the semiconductor layer SC1 is formed of indium gallium zinc oxide. The thickness of the semiconductor layer SC1 is, for example, 30 to 100 nm.

The semiconductor layer SC1 includes a first region R1, a second region R2 and a channel region RC1 located between the first region R1 and the second region R2. In this embodiment, at least the channel region RC1 of the semiconductor layer SC1 opposes the gate line G. With this structure, the gate line G functions as a gate electrode of the switching element SW1 and also as a light-shielding portion which shields the light towards the semiconductor layer SC1 from the illumination device IL.

Note that, apart from this embodiment, the semiconductor layer SC1 may be formed of some other semiconductor than oxide semiconductors such as amorphous silicon, polycrystalline silicon and organic semiconductor.

The insulating layer 14 is provided on the insulating layer 13 and the semiconductor layer SC1, and covers the semiconductor layer SC1 and the like. For example, the insulating layer 14 is formed of an inorganic insulation material such as SiO. The thickness of the insulating layer 14 is, for example, 50 to 150 nm. In this embodiment, the insulating layer 14 may be referred to as the first insulating layer.

The gate electrode GE1 and lower contact electrodes BC1, BC2 are provided on the insulating layer 14. The gate electrode GE1 is located in the display area DA so as to oppose the channel region RC1 of the semiconductor layer SC1. The gate electrode GE1 is put through a contact hole CH1 formed in the insulating layers 13 and 14 and brought into contact with the gate line G. Note that the contact hole h1 is located apart from the semiconductor layer SC1.

The gate electrode GE1, the semiconductor layer SC1 and the like constitute the switching element SW1, which is a TFT. In this embodiment, the gate line G functions as a gate electrode of the switching element SW1 and therefore the switching element SW1 has a dual-gate structure. But the gate line G needs not necessarily oppose the channel region RC1. In other words, the gate line G may not necessarily function as a gate electrode of the switching element SW1 or as a light-shielding portion of the channel region RC1. In this case, the gate line G functions as power feeding wire to feed power to the gate electrode GE1.

The lower contact electrodes BC1 and BC2 are located in the non-display area NDA. The lower contact electrode BC1 is put in through the contact hole h2 formed in the insulating layers 12 to 14, so as to be brought into contact with the third region R3. The lower contact electrode BC2 is put in through the contact hole h3 formed in the insulating layers 12 to 14 so as to be brought into contact with the fourth region R4. Note that the contact holes h2 and h3 each are located apart from the gate electrode GE2.

The gate electrode GE1 and the lower contact electrodes BC1 and BC2 each have a three-layer stacked body (Ti-based/Ti-based/Al-based). The gate electrode GE1 and the lower contact electrodes BC1 and BC2 each includes a lower layer formed of a metallic material whose main component is Ti, an intermediate layer formed of a metallic material whose main component is Al, and an upper layer formed of a metallic material whose main component is Ti. The thickness of each of the gate electrode GE1 and the lower contact electrodes BC1 and BC2 is, for example, 300 nm or less.

Note that, apart from the embodiment, the array substrate AR may further comprise a semiconductor cap layer. The semiconductor cap layer is located between the insulating layer 14 and the gate electrode GE1 in a region opposing the semiconductor layer SC1. The semiconductor cap layer opposes at least the entire channel region RC1. For example, the semiconductor cap layer may oppose the entire semiconductor layer SC1. The semiconductor cap layer is formed of an oxide such as aluminum oxide (AlOx) or OS.

The insulating layer 15 is provided on the insulating layer 14, the gate electrode GE1 and the lower contact electrodes BC1 and BC2, and covers the gate electrode GE1, the lower contact electrodes BC1 and BC2 and the like. For example, the insulating layer 15 is configured as a stacked layer body of an insulating layer formed of SiO and an insulating layer formed of SiN. The thickness of insulating layer 15 is, for example, 300 nm or less.

A source line S and upper contact electrodes UC1 and UC2 are provided on the insulating layer 15.

The source line S is located in the display area DA. The source line S is put in through the contact hole h4 formed to the insulating layers 14 and 15 so as to be brought into contact with the first region R1 of the semiconductor layer SC1. Note that the contact hole h4 is located apart from the gate electrode GE1.

The upper contact electrodes UC1 and UC2 are located in the non-display area NDA. The upper contact electrode UC1 is put in through the contact hole h5 formed to the insulating layer 15 so as to be brought into contact with the lower contact electrode BC1. The upper contact electrode UC2 is put in through the contact hole h6 formed to the insulating layer 15 so as to be brought into contact with the lower contact electrode BC2.

The source line S and the upper contact electrodes UC1 and UC2 each have a three-layer stacked structure (Ti-based/Al-based/Ti-based). The thickness of each of the source line S and the upper contact electrodes UC1 and UC2 is, for example, 500 nm or less.

Note that, apart from this embodiment, the array substrate AR may be configured without the contact holes h2 and h3 or the lower contact electrodes BC1 and BC2. In this case, contact holes h5 and h6 are formed, which penetrate four layers of the insulating layers 12 to 15. But here, it may become difficult to form the contact holes h5 and h6 simultaneously with the contact hole h4.

By contrast, in this embodiment, it suffices if the contact holes h5 and h6 penetrate the insulating layer 15 and thus the depth of the contact holes h5 and h6 may be made close to the depth of the contact hole h4. Therefore, in this embodiment, the contact holes h5 and h6 can be formed well simultaneously with the contact hole h4.

The insulating layer 16 is provided on the insulating layer 15, the source line S and the upper contact electrodes UC1 and UC2, and covers the source line S, the upper contact electrodes UC1 and UC2 and the like. The insulating layer 16 is formed of an insulating material such as SiO, SiN or the like. In this embodiment, the insulating layer 16 is formed of SiO. The thickness of the insulating layer 16 is, for example, 200 nm or more.

A contact electrode CA1 is provided on the insulating layer 16 and is located in the display area DA. The contact electrode CA1 is put in through a contact hole h7 formed in the insulating layers 14 to 16 so as to be brought into contact with the second region R2 of the semiconductor layer SC1. The contact electrode CA1 covers the entire semiconductor layer SC1 exposed to the contact hole h7. Note that the contact hole h7 is located apart from the gate electrode GE1. In this embodiment, the contact hole h7 may be referred to as the first contact hole.

The contact electrode CA1 is formed of a light-transmissive transparent conductive material such as indium tin oxide (ITO), OS, indium zinc oxide (IZO) or the like. In this embodiment, the contact electrode CA1 is formed of ITO. The thickness of the contact electrode CA1 is, for example, 50 nm or less.

From the discussion provided above, one electrode brought into contact with the semiconductor layer SC1 is a transparent electrode (contact electrode CA1) and another electrode brought into contact with the semiconductor layer SC1 is a metal electrode (a source line S).

The insulating layer 16 covers the source line S, and thus ITO is not present so as to be brought into contact with an end portion of the source line S. With this structure, electrical short circuit with the source line S can be prevented. In this embodiment, the stacked layer body of the insulating layer 15 and insulating layer 16 may be referred to as a second insulating layer.

An insulating layer 17 is provided on the insulating layer 16 and the contact electrode CA1, and covers the contact electrode CA1 and the like. The insulating layer 17 is formed of an insulation material such as SiO, SiN or the like. In this embodiment, the insulating layer 17 is formed of SiN. The thickness of the insulating layer 17 is, for example, 50 nm or more. The insulating layer 17 has a function to block foreign matters such as moisture, gas and the like moving toward a first insulating substrate 10 side from the color filter CF, which will be described below. Further, the insulating layer 17 comprises a contact hole h20 which exposes the contact electrode CA1.

An insulating layer 18 is provided on the insulating layer 17. The insulating layer 18 includes a color filter CF and an organic insulating layer OI.

The color filter CF is provided on the insulating layer 17. The color filter CF comprises colored layers of different colors. The thickness of the color filter CF is, for example, 2,000 nm or less. But note that the thickness of the color filter CF may exceed 2,000 nm. The color filter CF and the insulating layer 17 comprises a contact hole h8 which exposes the contact electrode CA1.

The color filter CF has a first color layer CL1, a second color layer (not shown) and a third color layer CL3. In this embodiment, the first color layer CL1 is a red layer, the second color layer is a green layer, and the third color layer CL3 is a blue layer. The first sub-pixel SP1 includes the first color layer CL1, the second sub-pixel SP2 includes the second color layer and the third sub-pixel SP3 includes the third color layer CL3.

The first color layer CL1, the second color layer and the third color layer CL3 each comprise a first flat surface FS1 on an opposite side to a side opposing the first insulating substrate 10. Note that the first flat surface FS1 opposes the contact electrode CA2, which will be described later.

The array substrate AR comprises the color filter CF, and thus the liquid crystal display panel PNL has the so-called color filter on array (COA) structure. The structure of the COA contributes to high definition of the pixels PX (sub-pixels SP).

The organic insulating layer OI is provided on the color filter CF. The thickness of the organic insulating layer OI is, for example, 3,000 nm or less. But note that the thickness of the organic insulating layer OI may exceed 3,000 nm. The organic insulating layer OI comprises a contact hole h9 communicated to the contact hole h8. In this embodiment, a central axis of the contact hole h9 and a central axis AX of the contact hole h8 are located on the same straight line. But note that the central axis of the contact hole h9 and the central axis AX of the contact hole h8 need not necessarily be located on the same straight line. The contact hole h8 and the contact hole h9 constitute a contact hole h10. In this embodiment, the contact hole h10 may be referred to as a second contact hole.

The organic insulating layer CI is located between the color filter CF and the contact electrode CA2, which will be described later, and comprises a second flat surface FS2 in contact with the contact electrode CA2. Note that the second flat surface FS2 is a surface of the organic insulating layer OI, which is on an opposite side to a side opposing the color filter CF. Here, the first flat surface FS1 and the second flat surface FS2 are parallel to the X-Y plane.

A second taper angle of an inner circumferential surface of the organic insulating layer OI in the contact hole h9 is greater than a first taper angle of an inner circumferential surface of the color filter CF in the contact hole h8 and should preferably be closer to 90° than the first taper angle. Here, the second taper angle is, for example, 70° to 80°.

Here, a minimum distance from the central axis AX of the contact hole h8 (the contact hole h10) to the first flat surface FS1 in a direction parallel to the second flat surface FS2 (the first flat surface FS1) is defined as a first minimum distance D1. Further, a minimum distance from the central axis of the contact hole h8 (the contact hole h10) to the second flat surface FS2 in a direction parallel to the second flat surface FS2 (the first flat surface FS1) is defined as a second minimum distance D2. Here, the second minimum distance D2 is less than the first minimum distance D1.

With the above-described structure, according to this embodiment, the layoutable area can be expanded in a section above the color filter CF in the array substrate AR, making it possible to effectively utilize the region around the contact hole h9 as compared to the case where an organic insulating layer OI comprising a second flat surface FS2 is not provided in the array substrate AR.

In this embodiment, the organic insulating layer OI does not completely cover the inner circumferential surface of the color filter CF and the insulating layer 17 in the contact hole h8. But the organic insulating layer OI may completely cover the inner circumferential surface of the color filter CF and the insulating layer 17.

In this embodiment, the stacked layer body of the insulating layer 17 and the insulating layer 18 may be referred to as a third insulating layer.

The contact electrode CA2 and the connecting electrode CN1 are provided on the insulating layer 18. The contact electrode CA2 is located in the display area DA. The contact electrode CA2 is put in through the contact hole h10 and contact hole h20 so as to be brought into contact with the contact electrode CA1. The contact electrode CA2 covers the inner circumferential surface of the organic insulating layer OI, the color filter CF and the insulating layer 17 in the contact hole h10. Further, the contact electrode CA2 is in contact with color filters CF of different colors in the contact hole h8. In this embodiment, as will be described later, the contact electrode CA2 does not completely cover the inner circumferential surface of the organic insulating layer OI, the color filter CF and the insulating layer 17. But the contact electrode CA2 may completely cover the inner circumferential surface of the organic insulating layer OI, the color filter CF and the insulating layer 17.

The connecting electrode CN1 is located in the non-display area NDA. The connecting electrode CN1 is located apart from the contact electrode CA2.

The contact electrode CA2 and the connecting electrode CN1 are formed of a light-transmissive transparent conductive material such as ITO, OS, IZO or the like. In this embodiment, the contact electrode CA2 and the connecting electrode CN1 are formed of ITO. The thickness of each of the contact electrode CA2 and the connecting electrode CN1 is, for example, 50 nm or less.

The insulating layer 19 is provided on the insulating layer 18, the contact electrode CA2 and the connecting electrode CN1, and covers the contact electrode CA2, the connecting electrode CN1 and the like. The insulating layer 19 is formed of an insulation material such as SiN or the like. In this embodiment, the insulating layer 19 is formed in SiN. The thickness of insulating layer 19 is, for example, 50 to 150 nm. In this embodiment, the insulating layer 19 may be named referred to as a fourth insulating layer.

A second common electrode CE2 is provided on the insulating layer 19 and is located in the display area DA and the non-display area NDA. The second common electrode CE2 opposes the contact electrode CA2, and forms a part of the storage capacitor CS (FIG. 3). The second common electrode CE2 comprises an opening OP1 located in a region opposing the contact electrode CA2.

The second common electrode CE2 is formed of a light-transmissive transparent conductive material such as ITO, OS, IZO or the like. In this embodiment, the second common electrode CE2 is formed of ITO. The thickness of second common electrode CE2 is, for example, 50 nm or less.

A metal layer ME is provided on the second common electrode CE2 and is brought into contact with the second common electrode CE2. The metal layer ME is formed of a light-shielding material such as a metal or the like. In this embodiment, the metal layer ME is formed of molybdenum tungsten (MoW). The thickness of the metal layer ME is, for example, 10 to 150 nm.

The insulating layer 20 is provided on the insulating layer 19, the second common electrode CE2 and the metal layer ME, and covers the second common electrode CE2, the metal layer ME and the like. The insulating layer 20 is formed of an insulation material such as SiN or the like. In this embodiment, the insulating layer 20 is formed in SiN. The thickness of the insulating layer 20 is, for example, 50 to 150 nm. In this embodiment, the insulating layer 20 may be referred to as a fifth insulating layer.

The pixel electrode PE and the connecting electrode CN2 are provided on the insulating layer 20.

The pixel electrode PE is located in the display area DA. The pixel electrode PE is put through the contact hole h11 formed in the insulating layers 19 and 20 and surrounded by the opening OP1, so as to be brought into contact with the contact electrode CA2. The pixel electrode PE oppose the second common electrode CE2 and forms a part of the storage capacitor CS.

The connecting electrode CN2 is located in the non-display area NDA. The connecting electrode CN2 is located apart from the pixel electrode PE. The connecting electrode CN2, on one hand, is put in through the contact hole h12 formed in the insulating layer 20 so as to be brought into contact with the second common electrode CE2. On the other hand, the connecting electrode CN2 is put in through the contact hole h13 formed in the insulating layers 19 and 20 so as to be brought into contact with the connecting electrode CN1.

The pixel electrode PE and the connecting electrode CN2 are formed of a light-transmissive transparent conductive material such as ITO, OS, IZO or the like. In this embodiment, the pixel electrode PE and the connecting electrode CN2 are formed of ITO. The thickness of each of the pixel electrode PE and the connecting electrode CN2 is, for example, 50 nm or less.

An insulating layer 21 is provided on the insulating layer 20, the pixel electrode PE and the connecting electrode CN2, and covers the pixel electrode PE, the connecting electrode CN2 and the like. The insulating layer 21 is formed of an insulation material such as SiN or the like. In this embodiment, the insulating layer 21 is formed of SiN. The thickness of the insulating layer 21 is, for example, 50 to 150 nm. In this embodiment, the insulating layer 21 may be referred to as a sixth insulating layer.

The first common electrode CE1 is provided on the insulating layer 21 and is located in the display area DA and the non-display area NDA. The first common electrode CE1 is put in through the contact hole h14 formed in the insulating layer 21 so as to be brought into contact with the connecting electrode CN2. The first common electrode CE1 opposes the pixel electrode PE and forms a part of the storage capacitor CS.

The first common electrode CE1 is formed of a light-transmissive transparent conductive material such as ITO, OS, IZO or the like. In this embodiment, the first common electrode CE1 is formed of ITO. The thickness of the first common electrode CE1 is, for example, 50 nm or less.

A spacer 28 is provided on the first common electrode CE1. The spacer 28 overlaps the metal layer ME. In this embodiment, the spacer 28 is a columnar spacer formed of an organic insulating material. The height of the spacer 28 is, for example, 3,000 nm or less.

On the insulating layer 21, the first common electrode CE1 and the spacer 28, the alignment film 29 is provided.

In contrast, the counter-substrate CT comprise a second insulating substrate 50 of a light-transmissive glass substrate, resin substrate or the like and an alignment film 51. The alignment film 51 is provided on a surface on a side opposing the alignment film 29 of the second insulating substrate 50.

Each of the alignment films 29 and 51 has a function of aligning liquid crystal molecules contained in the liquid crystal layer LC in an initial alignment direction. For example, each of the alignment films 29 and 51 is an optical alignment film subjected to an optical alignment process to irradiate ultraviolet radiation to the polymer membrane such as polyimide to impart anisotropy thereto. But each of the alignment films 29 and 51 may be a rubbing alignment film subjected to the rubbing treatment. Alternatively, one of the alignment films 29 and 51 may be an optical alignment film, and the other may be a rubbing alignment film.

As described above, the array substrate AR comprises a plurality of transparent conductive layers TE. The transparent conductive layers TE are located above the insulating layer 16 and stacked one on another while opposing one another. Thus, a storage capacitor CS of a desired capacity can be formed in a limited region in plan view. One of the transparent conductive layers TE is a pixel electrode PE. The pixel electrode PE is electrically connected to the second region R2 of the semiconductor layer SC1 via the rest of the transparent conductive layers of all the transparent conductive layers TE.

In this embodiment, the array substrate AR comprises a first transparent conductive layer TE1, a second transparent conductive layer TE2, a third transparent conductive layer TE3, a fourth transparent conductive layer TE4 and a fifth transparent conductive layer TE5. The contact electrode CA1 is constituted by the first transparent conductive layer TE1. The contact electrode CA2 and the connecting electrode CN1 are each constituted by the second transparent conductive layer TE2. The second common electrode CE2 is constituted by the third transparent conductive layer TE3. The pixel electrode PE and the connecting electrode CN2 are each constituted by the fourth transparent conductive layer TE4. The first common electrode CE1 is constituted by the fifth transparent conductive layer TE5.

The contact electrode CA1, the contact electrode CA2 and the pixel electrode PE are electrically connected to each other to constitute a first electric system. For example, the pixel electrode PE is electrically connected to the second region R2 of the semiconductor layer SC1 via the contact electrode CA1 and the contact electrode CA2. The connecting electrode CN1, the second common electrode CE2, the connecting electrode CN2 and the first common electrode CE1 are electrically connected to each other to constitute a second electric system. The first electric system is electrically independent from the second electric system.

Figure 5:
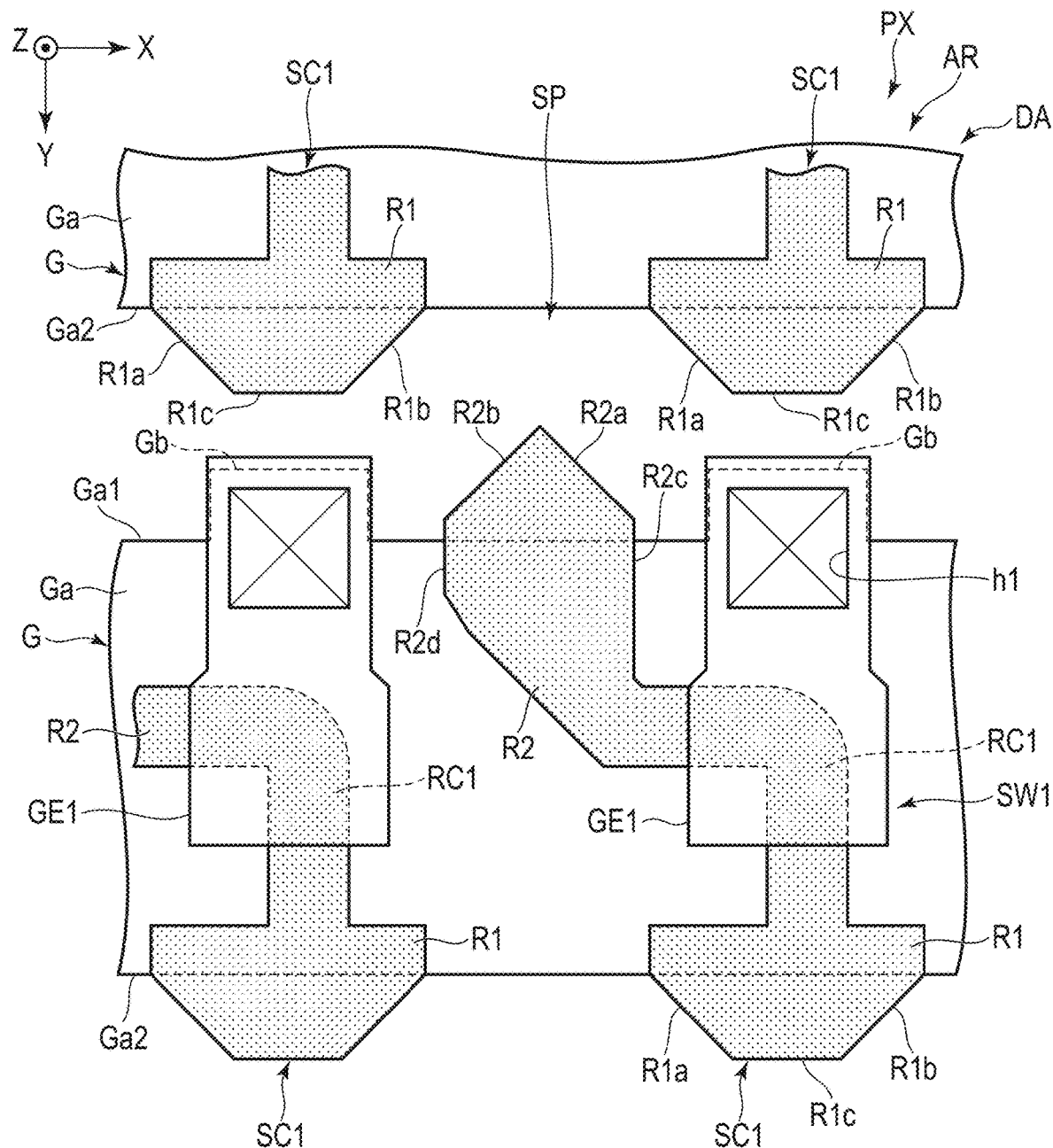
FIG. 5 is a partially enlarged plan view showing the display area of the array substrate of the liquid-crystal display panel, also showing a plurality of gate lines, semiconductor layers and gate electrodes.

FIG. 5 is a partially enlarged plan view showing the display area DA of the array substrate AR and also illustrating a plurality of gate lines G, semiconductor layers SC1 and gate electrodes GE1. In the drawing, the semiconductor layers SC1 are illustrated by dot patterns.

As shown in FIG. 5, the gate lines G include main line portions Ga and a plurality of protruding portions Gb formed to be integrated with the main line portions Ga, respectively. The main line portions Ga extend in the first direction X. The main line portions Ga include side edges Ga1 and Ga2 parallel to the first direction X. In the display area DA, the width of the main line portions Ga taken in the second direction Y is constant over its full region. The protruding portions Gb are located on a side edge Ga1 side of the main line portions Ga and they protrude from the side edges Ga1 in the second direction Y and are arranged in the first direction X with intervals therebetween. In this embodiment, the protruding portions Gb have a quadrilateral shape. The protruding portions Gb are provided to secure the area which functions as a seat for the gate electrode GE1. In other words, the protruding portions Gb are provided to expand the region on which the contact hole h1 can be formed.

The gate electrode GE1 is electrically connected to one of the gate lines G and is located in a region overlapping the gate line G. The gate electrode GE1 extends in the second direction Y so as to overlap the main line portions Ga and the protruding portions Gb. The contact hole h1 is formed over across the main line portions Ga and the protruding portions Gb. The contact hole h1 is formed to be separated from the outline of the gate line G with a gap therebetween. The entire contact hole h1 is covered by the gate electrode GE1. Note that the position and size of the contact hole h1 shown in FIG. 5 are taken at the bottom of the contact hole h1 (an interface between the gate line G and the insulating layer 13).

The width of the gate electrode GE1 in the first direction X is not constant over its entirety. In the gate electrode GE1, the width of the region overlapping the semiconductor layer SC1 is larger than the width of the region overlapping the protruding portions Gb. In this embodiment, in the first direction X, the width of the region overlapping the protruding portions Gb of the gate electrode GE1 is the same as the width of the protruding portions Gb. Further, the gate electrode GE1 is not located to be shifted from the protruding portions Gb in the first direction X. In the second direction Y, the gate electrode GE1 extends over edges of the protruding portions Gb towards an adjacent gate line G side.

The channel region RC1 of the semiconductor layer SC1 overlaps the gate line G (the main line portion Ga) and a wide portion of the gate electrode GE1. The channel region RC1 bends in a region overlapping the gate electrode GE1 (the wide portion). In this embodiment, the channel region RC1 includes a portion extending in the first direction X and a portion extending in the second direction Y, and is bent at an angle from 70° to 110°. It is preferable that the portion of the channel region RC1, which extends in the first direction X and the portion which extends in the second direction Y are located to make an angle from 80° to 100°, and more preferably they make a bending angle of 90°. A channel width of the channel region RC1 is constant over its entirety, but a slight dispersion in the channel width, which may occur during the actual production is allowed in a certain range. The edge on a first region R1 side of the channel region RC1 is located to be separated from a side edge of the gate electrode GE1 (the wide portion) with a gap therebetween in the first direction X.

Even for high-definition pixels PX (sub-pixels SP), with the channel region RC1 bent in the semiconductor layer SC1, a sufficient channel length can be secured. Note that when a sufficient channel length cannot be secured, the channel region RC1 is formed into a conductor (metalized), and the characteristics of the semiconductor cannot be easily obtained.

In consideration of the securing a sufficient channel length and the alignment of the semiconductor layer SC1 and the gate electrode GE1, it is more desirable that the gate electrode GE1 comprise a wide portion as discussed above. But note that the gate electrode GE1 may not include the wide portion, or in other words, the width of the gate electrode GE1 in the first direction X may be constant over in its entirety.

In the second direction Y, the channel region RC1 is located to be separated from the contact hole h1 with a gap therebetween. By securing a margin from the contact hole h1 to the channel region RC1, it is possible to avoid the contact hole h1 and the channel region RC1 from overlapping each other. Thus, electrical short-circuiting between the semiconductor layer SC1 and the gate electrode GE1, which may occur when they are brought into contact with each other, can be avoided.

The first region R1 of the semiconductor layer SC1 extends in the second direction Y and includes an expanding portion locating over across the side edge Ga2. In the region off the gate line G, the expanding portion of the first region R1 comprises a first side R1a, a second side R1b and a third side R1c located between the first side R1a and the second side R1b, and has a trapezoidal shape. The third side R1c is parallel to the first direction X and located to be spaced apart from the contact hole h1 in the second direction Y with a gap therebetween. By securing a margin from the contact hole h1 to the first region R1, electrical short-circuiting between pixels adjacent to each other in the second direction can be avoided.

Further, a plurality of first regions R1 (expanding portions) arranged in the first direction X are provided to be spaced apart from each other with intervals therebetween in the first direction X.

The second region R2 of the semiconductor layer SC1 is bent in a region overlapping the gate lines G (the main line portions Ga). In this embodiment, the second region R2 includes a portion extending in the first direction X and a portion extending in the second direction Y, and is bent at an angle from 70° to 110°.

It is preferable that the portion of the second region R2, which extends in the first direction X and the portion which extends in the second direction Y are bent at an angle from 80° to 100°, and more preferably they make a bending angle of 90°. The second region R2 includes an expanding portion located over across the side edge Ga1. In a region off the gate line G, the expanding portion of the second region R2 comprises a first side R2a and a second side R2b, and has a triangular shape.

The first side R2a of the second region R2 opposes the first side R1a of the first region R1, which is located in an upper right section therefrom, with a gap therebetween. For example, the first side R2a and the first side R1a should desirably be parallel to each other. The second side R2b of the second region R2 opposes the second side R1b of the first region R1, which is located in an upper left section therefrom, with a gap therebetween. For example, the second side R2b and the second side R1b should desirably be parallel to each other.

As described above, the first side R1a and the second side R1b are provided for the first region R1 and the first side R2a and the second side R2b are provided for the second region R2. With this structure, an insulation distance between the second region R2 and the first region R1 of another semiconductor layer SC1 can be secured and the expanding portions of the first region R1 and the second region R2 can be expanded efficiently.

Further, the second region R2 of the semiconductor layer SC1 further comprises a third side R2c continuous from the first side R2a and a fourth side R2d continuous from the second side R2b. The third side R2c and the fourth side R2d each are parallel to the second direction Y and they intersect the side edge Ga1. The third side R2c opposes the gate electrode GE1 which is located next to the right (that is, the gate electrode GE1 of the same sub-pixel SP), with a gap therebetween. The fourth side R2d opposes the gate electrode GE1 which is located next to the left (the gate electrode GE1 of the sub-pixel SP next on the left), with a gap therebetween.

By securing a margin from the contact hole h1 to the second region R2, electrical short-circuiting between the gate electrode GE1 and the semiconductor layer SC1 can be avoided. Thus, as described above, the semiconductor layer SC1 can be expanded as much as possible within a range that the margin can be secured.

Figure 6:
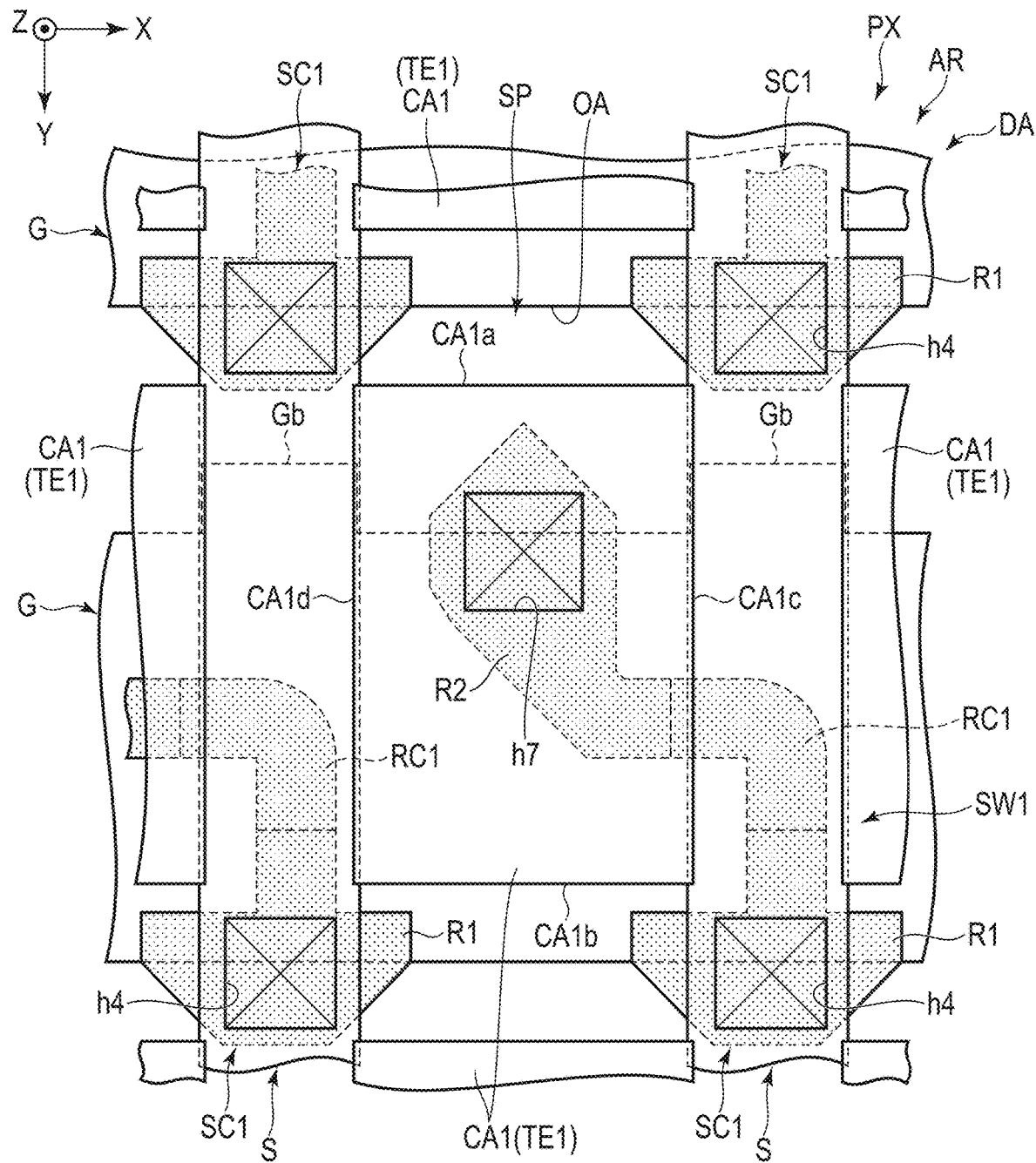
FIG. 6 is a partially enlarged plan view showing the display area of the array substrate, also showing a plurality of gate lines, semiconductor layers, source lines and contact electrodes.

FIG. 6 is a partially enlarged plan view showing the display area DA of the array substrate AR, which also illustrates a plurality of gate lines G, semiconductor layers SC1, source lines S and contact electrodes CA1 (a plurality of first transparent conductive layers TE1).

As shown in FIG. 6, contact holes h4 are formed in regions opposing the expanding portions of the first regions R1 of the semiconductor layers SC1, respectively. Note that the positions and size of the contact holes h4 shown in FIG. 6 are taken at the bottom of the contact holes h4 (an interface between each semiconductor layer SC1 and the insulating layer 14).

The source lines S each extend in the second direction Y and intersect the gate lines G. The source lines S overlap the semiconductor layers SC1 and the gate electrodes GE1, respectively (see FIG. 5). Therefore, the gate electrodes GE1 are located in respective regions overlapping the respective gate lines G and the respective source lines S. The channel regions RC1 of the semiconductor layers SC1 are bent in respective regions overlapping the respective gate lines G and the respective source lines S.

In the display area DA, the width of the source lines S in the first direction X is constant over its entirely. In this embodiment, in the first direction X, the width of the source lines S should desirably be the same as or less than the width of the protruding portions Gb in the regions except for that on which the gate lines G are formed. The source lines S cover the entire contact hole h4. One of the source lines S is electrically connected to the expanding portion of the first region R1 through the respective contact hole h4.

As can be seen from the above description, the expanding portion of the first region R1 is provided to secure an area by which the respective section can function as a seat for the source line S.

An open area OA of each sub-pixel SP is surrounded by a respective adjacent pair of those of the gate lines G and a respective adjacent pair of those of the source lines S. In the semiconductor layer SC1, a part of the expanding portion of the first region R1 and a part of the expanding portion of the second region R2 are located in the open area OA.

As shown in FIG. 6, the width of the open area OA in the second direction Y is less than width of the gate lines G in the second direction Y. For example, the width of the open area OA in the second direction Y is 3 nm, whereas the width of the gate lines G in the second direction Y is 5 nm.

The contact hole h7 is formed in a region opposing the expanding portion of the second region R2 of the respective semiconductor layer SC1. Note that the position and size of the contact hole h7 shown in FIG. 6 are taken at the bottom of the contact holes h7 (an interface between the respective semiconductor layer SC1 and the respective insulating layer 14).

The sub-pixels SP comprise contact electrodes CA1, respectively. The contact electrodes CA1 are arranged in a matrix in the first direction X and the second direction Y. The contact electrode CA1 has a quadrilateral shape. The contact electrode CA1 comprises a first side CA1a and a second side CA1b, parallel to the first direction X, and a third side CA1c and a fourth side CA1d, parallel to the second direction Y.

The first side CA1a is located in the open area OA of its respective sub-pixel SP.

The second side CA1b overlaps the gate line G electrically connected to the switching element SW1 of the respective sub-pixel SP.

The third sides CA1c is located to a right-hand side (a source line S side electrically connected to the switching element SW1 of the respective sub-pixel SP) with respect to the contact hole h7 of the respective sub-pixel SP.

The fourth side CA1d is located to a left-hand side with respect to the contact hole h7 of the respective sub-pixel SP.

As can be seen from the description provided above, the contact electrode CA1 and the contact hole h7 are located in the open area OA together with the expanding portion of the respective second region R2.

The third side CA1c may be located between the contact hole h7 of the respective sub-pixel SP and the right-hand-side source line S, or may overlap the right-hand-side source line S. The fourth side CA1d may be located between the contact hole h7 of the respective sub-pixel SP and the left-hand-side source line S, and may overlap the left-hand-side source line S.

In this embodiment, the third side CA1c overlaps a left side of the right-hand-side source line S, and the fourth side CA1d overlaps a right side of the left-hand-side source line S. In other words, in the first direction X, the width of the contact electrode CA1 is the same as the width of the open area OA.

The first side CA1a, the second side CA1b, the third side CA1c and the fourth side CA1d are each located to be spaced apart from the contact hole h7. By securing a margin from the contact hole h7 to each of the first side CA1a, the second side CA1b, the third side CA1c and the fourth side CA1d, the entire contact hole h7 can be covered by the contact electrode CA1. Thus, in the manufacturing process, it is possible to avoid the second region R2 (the semiconductor layer SC1) from being lost.

A gap between the contact hole h7 and the first side CA1a in the second direction Y, a gap between the contact hole h7 and the third side CA1c in the first direction X and a gap between the contact hole h7 and the fourth side CA1d in the first direction X should preferably be the same as each other. A gap between the contact hole h7 and the second side CA1b in the second direction Y is greater than each of these gaps. Thus, a contact region for the contact electrode CA1 and the contact electrode CA2 can be secured between the contact hole h7 and the second side CA1b.

Figure 7:
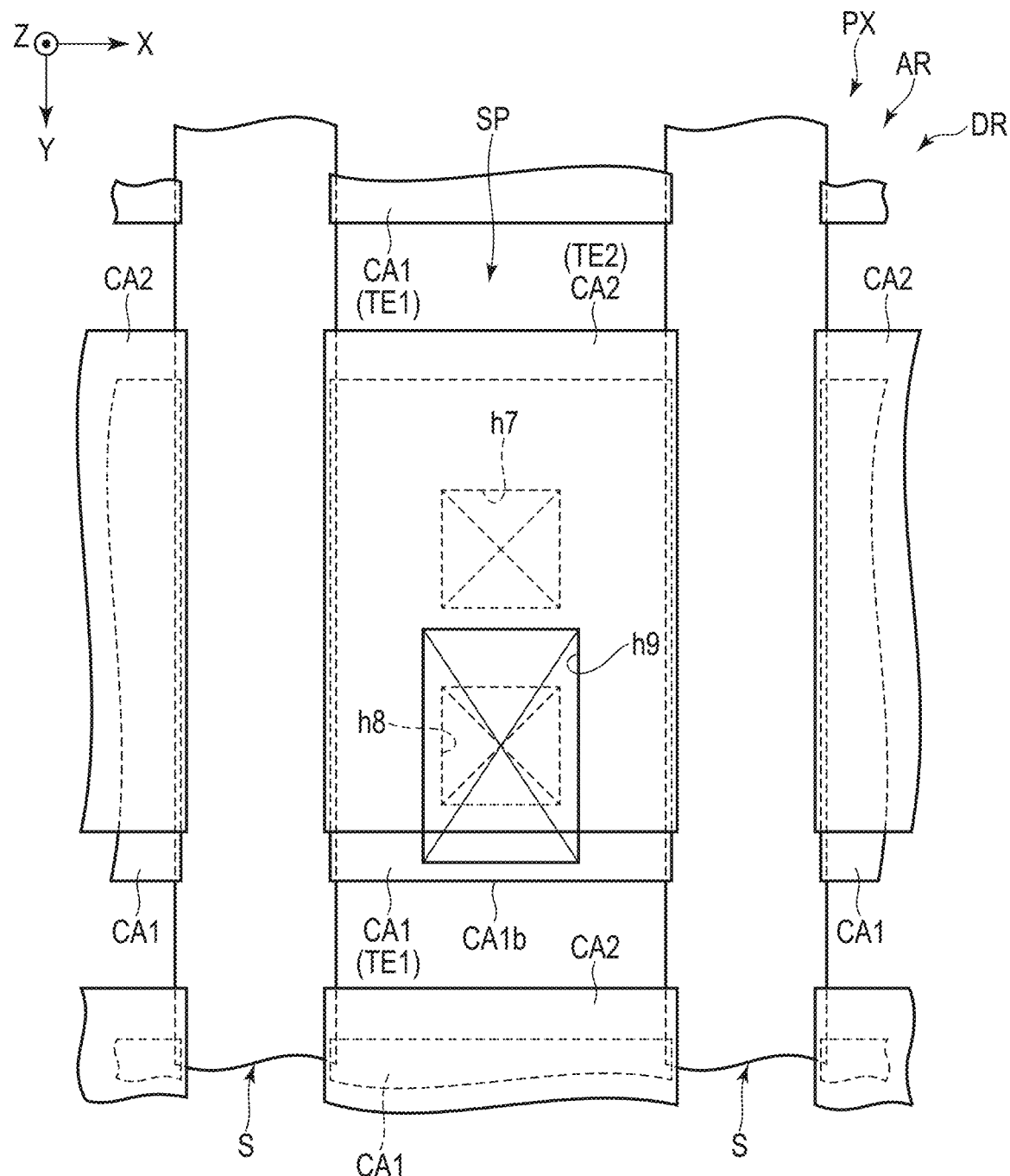
FIG. 7 is a partially enlarged plan view showing the display area of the array substrate, also showing a plurality of source lines and contact electrodes.

FIG. 7 is a partially enlarged plan view showing the display area DA of the array substrate AR, which also illustrates a plurality of source lines S, contact electrodes CA1 (first transparent conductive layers TE1) and contact electrodes CA2 (second transparent conductive layers TE2).

As shown in FIG. 7, the contact hole h8 is located between the contact hole h7 and the second side CA1b and is formed in a region opposing the contact electrode CA1. In the second direction Y, the contact hole h8 is located to be spaced apart from the contact hole h7. But, a part of the contact hole h8 may overlap the contact hole h7. The contact hole h9 overlaps the contact hole h8. The size of the contact hole h9 is set greater than the size of the contact hole h8. Note that the position and size of the contact hole h8 shown in FIG. 7 are taken at the bottom of (an interface between the contact electrode CA1 and the insulating layer 17) of the contact hole h8. The position and size of the contact hole h9 shown in FIG. 7 are taken at the bottom of the contact hole h9. In this embodiment, the bottom of the contact hole h9 is located in an interface between the color filter CF and the organic insulating layer OI.

Note, through omitted in FIG. 7, the contact hole h7, the contact hole h8 and the contact hole h9 overlap the respective gate line G in FIG. 7 as well as so in FIGS. 4, 5 and 6.

Note, as described above, the organic insulating layer OI may completely cover the inner circumferential surface of the color filter CF and the insulating layer 17 in the contact hole h8. In this case, the bottom of the contact hole h9 is located in the interface between the contact electrode CA1 and the organic insulating layer OI.

The sub-pixels SP comprise contact electrodes CA2, respectively. The contact electrodes CA2 are arranged in a matrix in the first direction X and the second direction Y. The contact electrodes CA2 have a quadrilateral shape. Each contact electrode CA2 covers a part of the respective contact hole h9. It suffices if the contact electrode CA2 is partially connected to the contact electrode CA1 through the contact holes h8 and h9. In the preparation of the contact electrode CA2, ITO of the contact electrode CA1 is crystallized. Therefore, even if the contact electrode CA2 does not cover the entire contact hole h9, the contact electrode CA1 is not lost.

But the contact electrode CA2 may cover the entire contact hole h9.

Further, as shown in FIG. 4, the contact electrode CA2 is brought into contact with in the first color layer CL1 and the third color layer CL3 of a color which is different from that of the first color layer CL1, in the contact hole h8. When FIG. 7 is described based on the illustration of FIG. 4, the contact hole h7 overlaps the third layer CL3, and the contact hole h8 is an opening of the color filter CF formed in a region between the first color layer CL1 and the third color layer CL3. The opening of the color filter CF overlaps the respective gate line G. The opening of the color filter CF may be formed in a border between color layers of different colors.

The right side of the contact electrode CA2 may be located between the contact hole h9 of the respective sub-pixel SP and the right-hand-side source line S, and may overlap the right-hand-side source line S. The left side of the contact electrode CA2 may be located between the contact hole h9 of the respective sub-pixel SP and the left-hand-side source line S, and may overlap the left-hand-side source line S.

In this embodiment, the right side of the contact electrode CA2 overlaps the left side of the right-hand-side source line S, and the left side of the contact electrode CA2 overlaps the right side of the left-hand-side source line S. In other words, in the first direction X, the width of the contact electrode CA2 is the same as the width of the contact electrode CA1.

For example, the contact electrode CA2 includes an upper end portion which does not overlap the contact electrode CA1. On the other hand, the contact electrode CA1 includes a lower end portion which does not overlap the contact electrode CA2.

Figure 8:
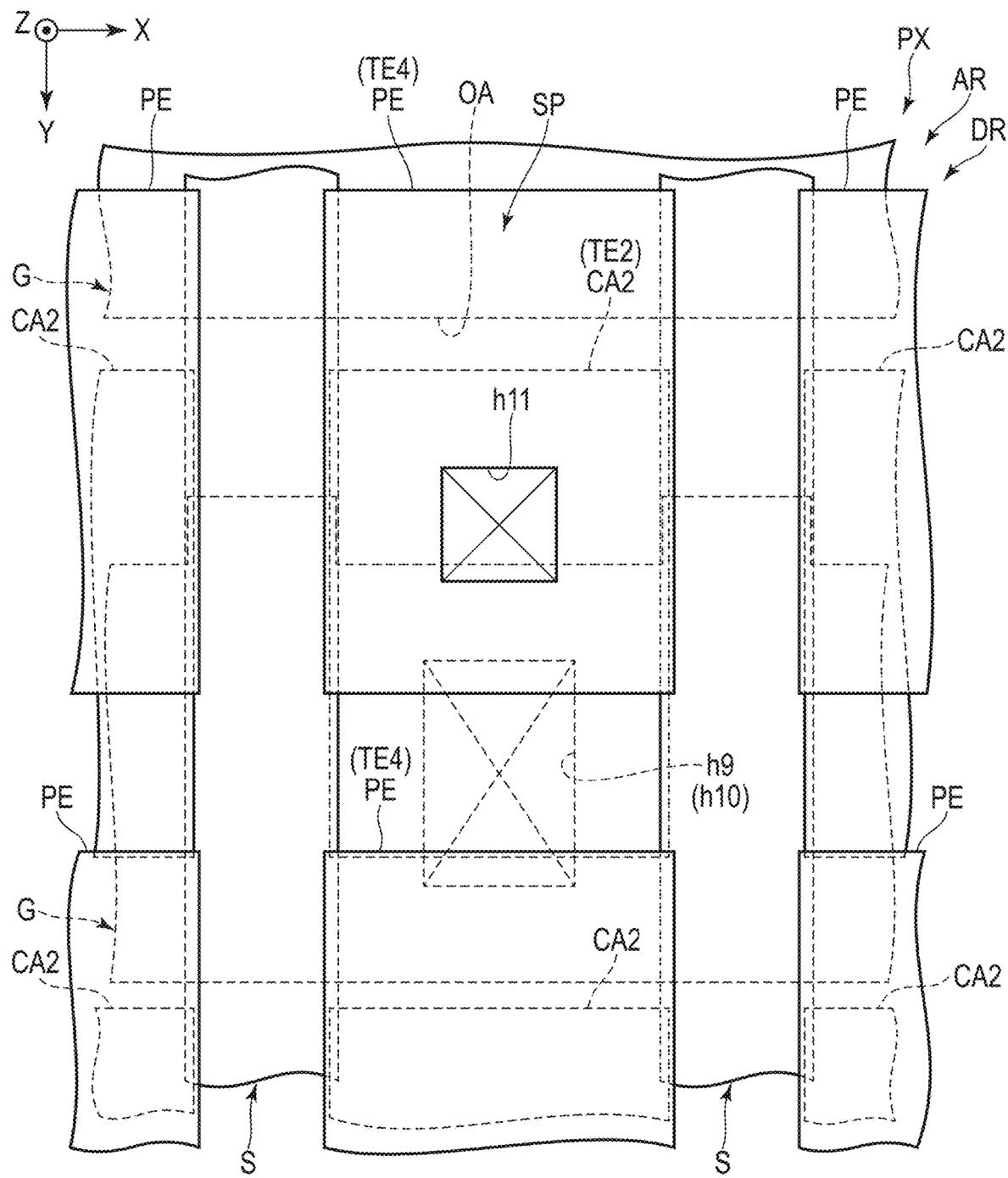
FIG. 8 is a partially enlarged plan view showing the display area of the array substrate, also showing a plurality of gate lines, source lines, contact electrodes and pixel electrodes.

FIG. 8 is a partially enlarged plan view showing the display area DA of the array substrate AR, which also illustrates a plurality of gate lines G, source lines S, contact electrodes CA2 (second transparent conductive layers TE2) and pixel electrodes PE (fourth transparent conductive layers TE4).

As shown in FIG. 8, the contact hole h11 is located in a region overlapping the contact electrode CA2. In this embodiment, a part of the contact hole h11 is located in the open area OA. The contact hole h11 is located to be spaced apart from each of the sides of the contact electrode CA2.

The sub-pixels SP comprise pixel electrodes PE. The pixel electrodes PE are arranged in a matrix in the first direction X and the second direction Y. The pixel electrodes PE have a quadrilateral shape. The pixel electrodes PE each cover the entire respective contact hole h11. Parts of the pixel electrodes PE overlap the contact hole h10 (h9). But it is preferable that the pixel electrodes PE should not overlap the contact hole h10. This is because it is difficult to remove the pixel electrode PE in the contact hole h10, and short circuiting might occur between pixel electrodes PE adjacent to each other in the second direction Y.

The right side of the pixel electrode PE may be located between the contact hole h11 of the respective sub-pixel SP and the right-hand-side source line S, and may overlap the right-hand-side source line S. The left side of the pixel electrode PE may be located between the contact hole h11 of the respective sub-pixel SP and the left-hand-side source line S, and may overlap the left-hand-side source line S.

In this embodiment, the right side of the pixel electrode PE overlaps the left side of the right-hand-side source line S, and the left side of the pixel electrode PE overlaps the right side of the left-hand-side source line S. In other words, in the first direction X, the width of the pixel electrode PE is the same as the width of the contact electrode CA2.

In the embodiment, for example, the pixel electrodes PE each include an upper end portion which does not overlap the contact electrode CA2. On the other hand, the contact electrodes CA2 each include a lower end portion which does not overlap the pixel electrode PE.

Figure 9:
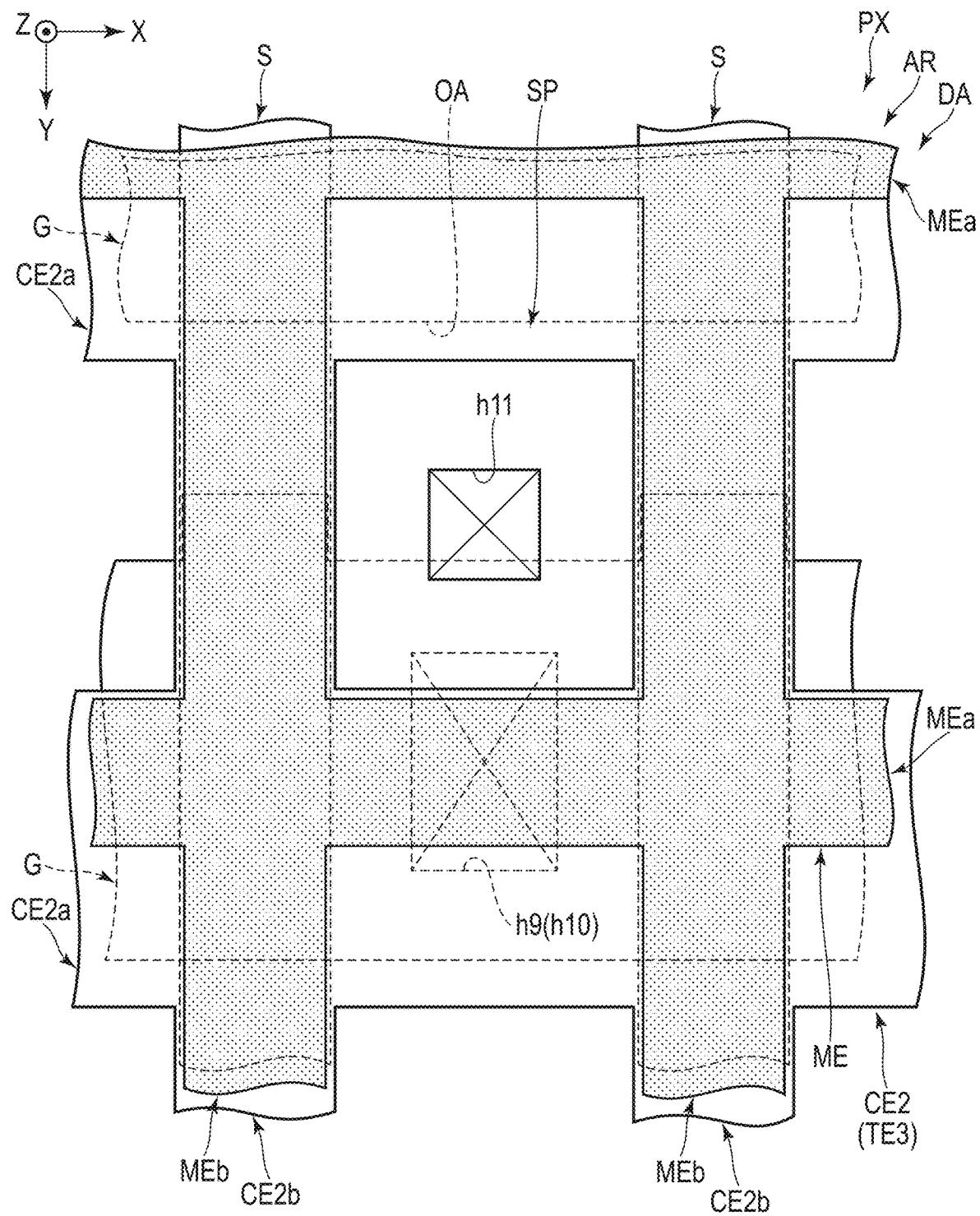
FIG. 9 is a partially enlarged plan view showing the display area of the array substrate, also showing a plurality of gate lines, source lines, a second common electrode and a metal layer.

FIG. 9 is a partially enlarged plan view showing the display area DA of the array substrate AR, which also illustrates a plurality of gate lines G, source lines S, a second common electrode CE2 (a third transparent conductive layer TE3) and a metal layer ME. In the drawing, the metal layer ME is illustrated by dot patterns.

As shown in FIG. 9, the second common electrode CE2 is formed into lattice form in the display area DA. The second common electrode CE2 comprises a plurality of first extending portions CE2a each extending in the first direction X and arranged in the second direction Y with intervals therebetween and a plurality of second extending portions CE2b each extending in the second direction Y and arranged in the first direction X with intervals therebetween, which are integrated with each other as one body. Each adjacent pair of first extending portions CE2a and each respective adjacent pair of second extending portions CE2b surround the contact hole h11.

Further, as shown in FIG. 9, each opening of the lattice-shaped second common electrode CE2 is greater than the respective open area OA and is less than each opening of the lattice-shaped metal layer ME.

In the second direction Y, the first extending portions CE2a are disposed so that the gaps between the first extending portions CE2a and the respective contact holes h11 are equal to each other. In this embodiment, the first extending portion CE2a does not entirely overlap the gate line G, but it may overlap the gate line G.

In the first direction X, the second extending portions CE2b are disposed so that the gaps between the second extending portions CE2b and the respective contact holes h11 are equal to each other. In this embodiment, the second extending portion CE2b entirely overlaps the source line S. In this embodiment, the width of the second extending portion CE2b in the first direction X is the same as the width of the source line S in the first direction X. But the width of the second extending portion CE2b may be less or greater than the width of the source line S. Each second common electrodes CE2 is commonly used by a plurality of sub-pixels SP.

The metal layer ME is formed into a lattice shape in the display area DA. The metal layer ME comprises a plurality of first metal layers MEa each extending in the first direction X and arranged in the second direction Y with intervals therebetween and a plurality of second metal layers MEb each extending in the second direction Y and arranged in the first direction X with intervals therebetween, integrated with each other into one body. Each adjacent pair of first metal layers MEa and each adjacent pair of second metal layers MEb surround the respective contact hole h11.

In the second direction Y, the width of the first metal layers MEa is less than the width of the first extending portions CE2a.

In this embodiment, the first metal layers MEa entirely overlap the first extending portions CE2a, respectively. In the first direction X, the second metal layers MEb are disposed so that the gaps between the second metal layers MEb and the respective contact holes h11 are equal to each other. In this embodiment, the second metal layer MEb entirely overlaps the source line S together with the second extending portion CE2b. In this embodiment, the width of the second metal layer MEb in the first direction X is the same as the width of the source line S in the first direction X. But the width of the second metal layer MEb may be less than the width of the source line S. Note that the width of the second metal layer MEb may be greater than the width of the source line S, but it is no preferable because such a structure causes reduction of the open area OA.

The metal layer ME functions as a light-shielding layer (the so-called black matrix) which surrounds the open area OA.

FIG. 10 is a partially enlarged plan view showing the display area DA of the array substrate AR, which also illustrates a plurality of gate lines G, source lines S, pixel electrodes PE and a first common electrode CE1.

As shown in FIG. 10, the first common electrode CE1 includes a plurality of extending portions CE1a located in the display area DA. The extending portions CE1a each extend in the first direction X, and are arranged in the second direction Y with intervals therebetween.

Each of the extending portions CE1a includes a main line portion CE1b and a plurality of protruding portions CE1c integrated with the main line portion CE1b as one body.

The main line portion CE1b extends in the first direction X, and the main line portion CE1b entirely overlaps the respective gate line G. The width of the main line portion CE1b in the second direction Y is constant over its entirety.

Each of the protruding portions CE1c is provided in a region overlapping the respective source line S, and projects in the second direction Y from the respective main line portion CE1b. The protruding portions CE1c are provided on respective sides of the respective main line portion CE1b. The protruding portions CE1c have a tapered shape which narrows down as apart away from the respective main line portion CE1b. In this embodiment, the protruding portions CE1c have a trapezoidal shape.

The extending portions CE1a have a line-symmetrical shape with respect to a symmetric axis parallel to the first direction X. In each pair of extending portions CE1a adjacent to each other in the second direction Y, a plurality of protruding portions CE1c of one extending portion CE1a and a plurality of protruding portions CE1c of the other extending portion CE1a are alternately provided in the first direction X.

Here, regions where the pixel electrodes PE, regions between the extending portions CE1a and the open areas OA overlap each other are referred to as overlapping regions. In the drawing, the overlapping regions are illustrated by dot patterns. Each pair of overlapping regions adjacent to each other in the first direction X are located to be line symmetrical with respect to the symmetric axis in the second direction Y. Each pair of overlapping regions adjacent to each other in the second direction Y are located to be line symmetrical with respect to the symmetric axis in the first direction X.

The liquid crystal layer LC is driven by an electric field produced between each pixel electrode PE and the respective first common electrode CE1.

Figure 11:
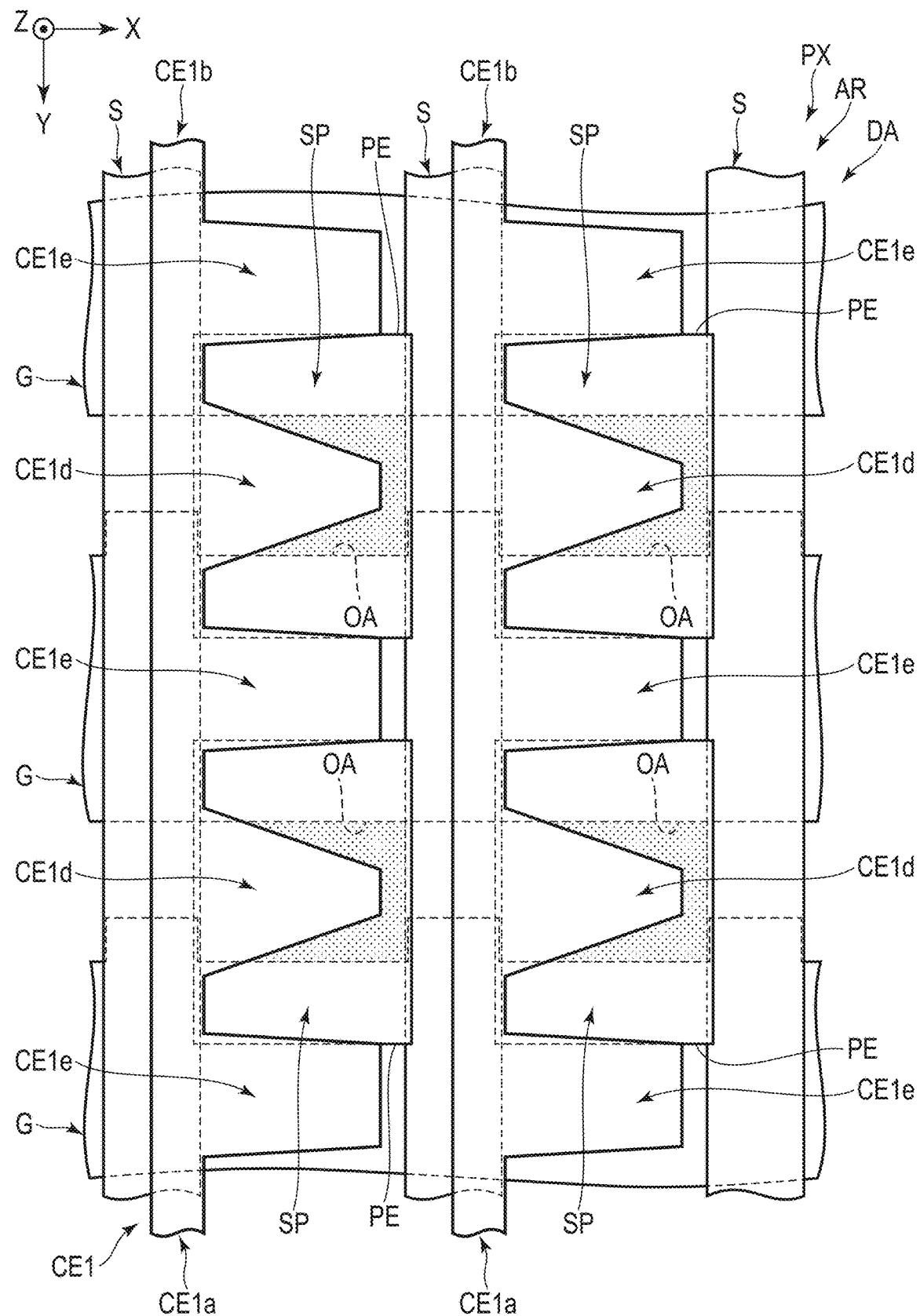
FIG. 11 is a partially enlarged plan view showing a display area of an array substrate according to a modified example of the embodiment, also showing a plurality of gate lines, source lines, pixel electrodes and the first common electrode.

Note that the configuration of the first common electrode CE1 is not limited to that of this embodiment, but can be modified in various ways. For example, the first common electrodes CE1 may be configured as shown in FIG. 11. FIG. 11 is a partially enlarged plan view showing the display area DA of the array substrate AR according to a modified example of this embodiment, which also illustrates a plurality of gate lines G, source lines S, pixel electrodes PE and a first common electrode CE1. In FIG. 11, the configuration except the first common electrode CE1 is the same as that of FIG. 10.

As shown in FIG. 11, the first common electrode CE1 includes a plurality of extending portions CE1a located in the display area DA. The extending portions CE1a each extend in the second direction Y and are arranged in the first direction X with intervals therebetween.

Each of the extending portions CE1a comprises a main line portion CE1b, a plurality of first protruding portions CE1d integrated with the main line portion CE1b as one body, and a plurality of second protruding portions CE1e integrated with the main line portion CE1b as one body.

The main line portions CE1b each extend in the second direction Y, and the main line portion CE1b at least partially overlaps the source line S. The width of the main line portions CE1b in the first direction X is constant over its entirety.

The first protruding portions CE1d are provided in the respective open areas OA, and project in the first direction X from the respective main line portions CE1b.

The second protruding portion CE1e is provided in region overlapping the respective gate line G, and project in the first direction X from the respective main line portion CE1b.

The first protruding portions CE1d and the second protruding portions CE1e are provided in one side of the respective main line portion CE1b. The first protruding portions CE1d and the second protruding portions CE1e have a tapered shape which narrows down so spaced away from the respective main line portion CE1b. In this embodiment, the first protruding portions CE1d and the second protruding portions CE1e have respective trapezoidal shapes. An angle between a side of each first protruding portion CE1d, which is inclined acute with respect to the first direction X and the first direction X is greater than an angle between a side of each second protruding portion CE1e, which is inclined acute with respect to the first direction X and the first direction X.

Here as well, regions where the pixel electrodes PE, regions between the extending portions CE1a and the open areas OA overlap each other are referred to as overlapping regions. In the drawing, the overlapping regions are illustrated by dot patterns.

The liquid crystal display device DSP of this embodiment is configured as discussed above.

Next, a manufacturing process of the liquid crystal display device DSP of the embodiment will be described. Here, in the manufacturing processes of the liquid crystal display device DSP, a manufacturing process for the array substrate AR will be described. FIGS. 12 to 20 are diagrams illustrating a method of manufacturing the array substrate AR. In FIGS. 12 to 20, a part of the display area is enlarged.

As shown in FIGS. 12 and 4, when production of the array substrate AR is started, first, a first insulating substrate 10 or a large-size plate including the first insulating substrate 10 and larger than the size of the first insulating substrate 10 is prepared. Then, on the first insulating substrate 10 (or the large-size plate), an insulating layer 11, a plurality of semiconductor layers SC2 and an insulating layer 12 are formed in order.

Next, on the insulating layer 12, a plurality of gate lines G and a plurality of gate electrodes GE2 are formed simultaneously. Note that imaginary referential lines are added in a lattice form to FIG. 12 (and FIGS. 13 to 20). In this embodiment, first referential lines RL1 in the first direction X are equivalent to lines equally dividing the respective main line portions Ga into two in the second direction Y and second referential lines RL2 in the second direction Y are equivalent to lines equally dividing the respective protruding portions Gb into two in the first direction X. A region surrounded by two first referential lines RL1 adjacent to each other and two second referential lines RL2 adjacent to each other is equivalent to a region (size) of a sub-pixel SP. In this embodiment, each sub-pixel SP is configured minutely to comprise one side of 10 μm or less.

After that, on the insulating layer 12, the gate lines G and the gate electrodes GE2, an insulating layer 13 is formed.

For example, the width of the gate line G is 5 μm, and the space between each adjacent pair of gate lines G is 3 nm. Note that the above-specified numeric values of the width of the gate line G and the space between adjacent gate lines G do not include those of the protruding portions Gb.

Figure 13:
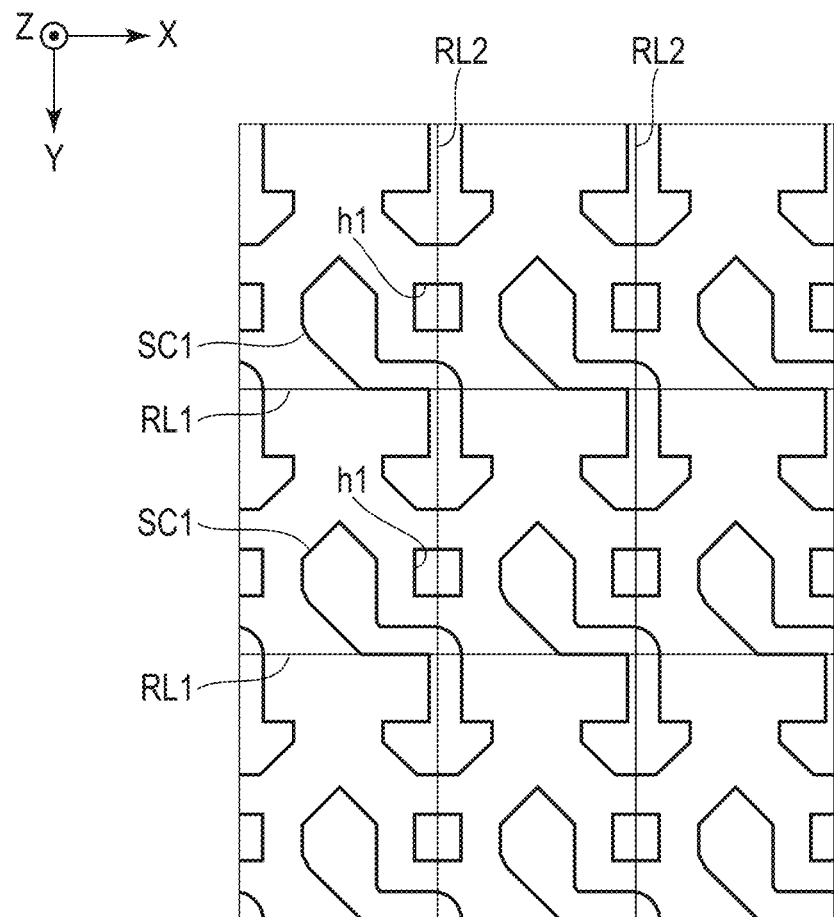
FIG. 13 is a plan view illustrating a step following that shown in FIG. 12 in the method of manufacturing the array substrate of the embodiment, also showing a plurality of semiconductor layers and contact holes.

As shown in FIGS. 13 and 4, subsequently, semiconductor layers SC1 are formed from an oxide semiconductor on the insulating layer 13. Then, on the insulating layer 13 and the semiconductor layers SC1, an insulating layer 14 is formed. After that, on the insulating layer 14, the above-described semiconductor cap layer is formed, and the semiconductor cap layer may be left to remain or removed after having been formed. Then, by dry etching, contact holes h1, h2 and h3 are formed at the same time. The contact hole h1 does not overlap the semiconductor layers SC1, and therefore it is possible to avoid the semiconductor layers SC1 from being lost.

Figure 14:
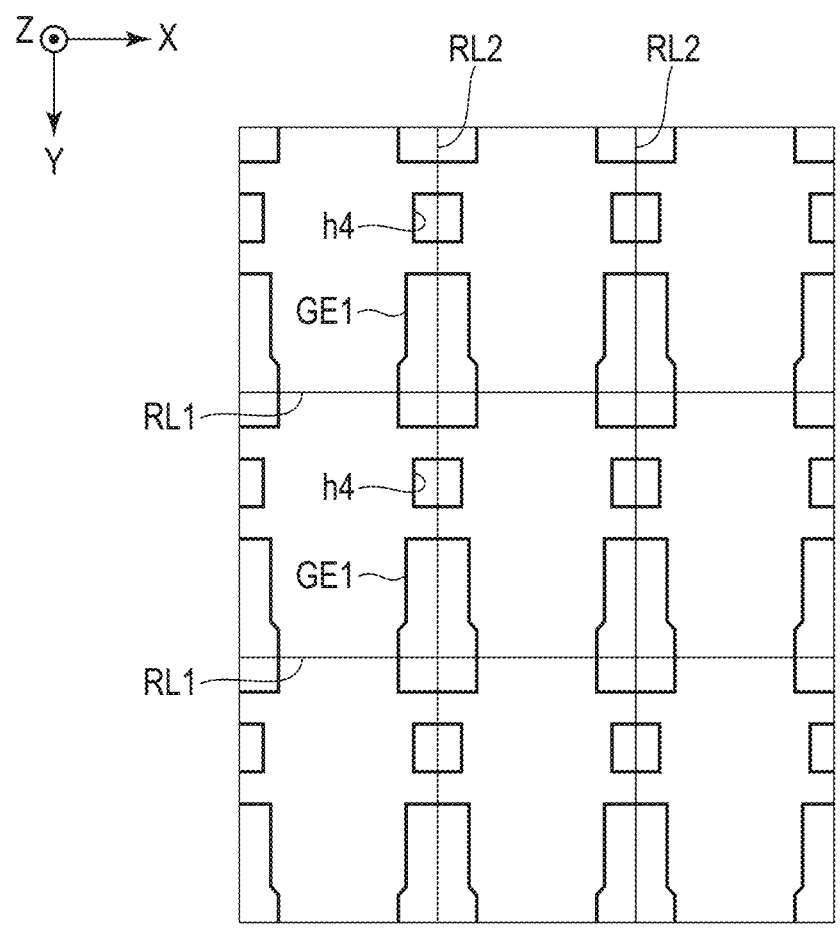
FIG. 14 is a plan view illustrating a step following that shown in FIG. 13 in the manufacturing method, also showing a plurality of gate electrodes and contact holes.

As shown in FIGS. 14 and 4, subsequently, gate electrodes GE1 and lower contact electrodes BC1 and BC2 are formed on the insulating layer 14. After that, the first region R1 and the second region R2 of each semiconductor layer SC1 are treated to have a low resistance. For example, an impurity is injected to the first region R1 and the second region R2 of the semiconductor layer SC1 using ion implantation technique. Examples of the impurity are phosphorus, boron and the like. Thus, a switching element SW1 comprising the semiconductor layer SC1, the gate electrode GE1 and the like is formed.

Next, on the insulating layer 14, the gate electrodes GE1 and the lower contact electrodes BC1 and BC2, an insulating layer 15 is formed. Subsequently, contact holes h4, h5 and h6 are formed at the same time.

Figure 15:
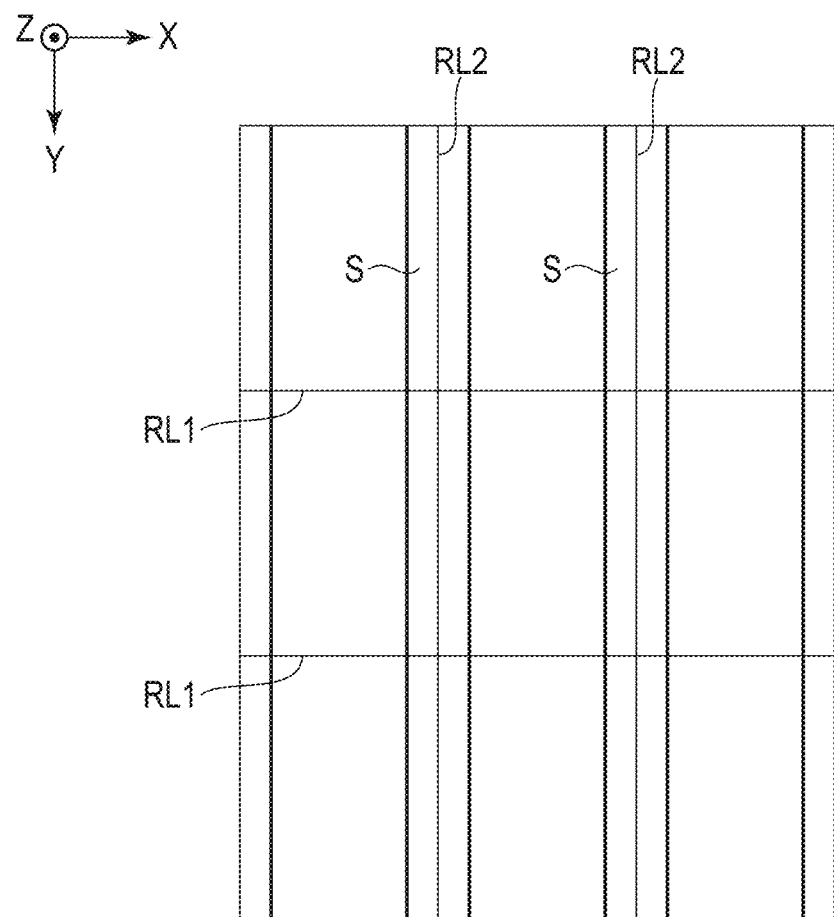
FIG. 15 is a plan view illustrating a step following that shown in FIG. 14 in the manufacturing method, also showing a plurality of source lines.

Then, as shown in FIGS. 15 and 4, the source lines S and the upper contact electrodes UC1 and UC2 are formed on the insulating layer 15 at the same time. After that, on the insulating layer 15, the source lines S and the upper contact electrodes UC1 and UC2, an insulating layer 16 is formed.

Figure 16:
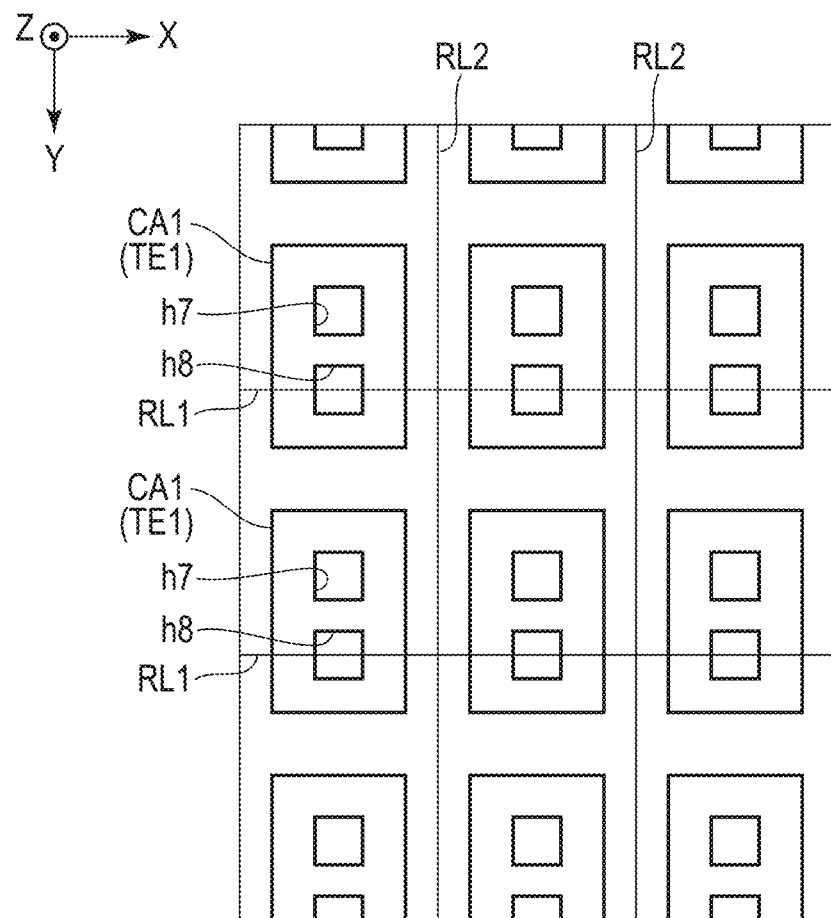
FIG. 16 is a plan view illustrating a step following that shown in FIG. 15 in the manufacturing method, also showing a plurality of contact electrodes and contact holes.

As shown in FIGS. 16 and 4, subsequently, contact holes h7 are formed, and then contact electrodes CA1 are formed on the insulating layer 16. The contact electrodes CA1 cover the entire contact holes h7, respectively. Thus, by the etching for forming the contact electrodes CA1, the loss of the semiconductor layers SC1 can be avoided.

After that, on the insulating layer 16 and the contact electrodes CA1, an insulating layer 17 and contact holes h17 are formed. Further, color filters CF are formed in order. The contact holes h17 can be formed by dry etching. Then, contact holes h8 are formed. The contact holes h8 are formed in the color filters CF in boundaries between different color layers, respectively. Subsequently, on the color filters CF, an organic insulating layer OI is formed.

The contact holes h17 are omitted from the illustration of FIG. 16, but as shown in FIG. 4, they overlap the contact holes h8, respectively.

Figure 17:
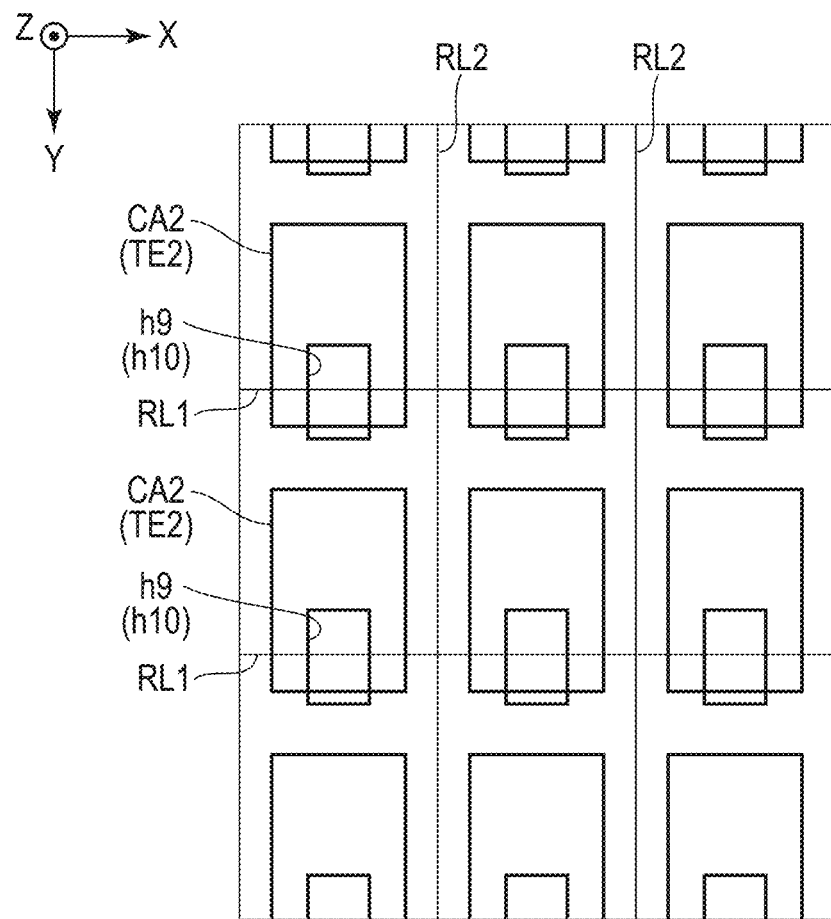
FIG. 17 is a plan view illustrating a step following that shown in FIG. 16 in the manufacturing method, also showing a plurality of contact electrodes and contact holes.

As shown in FIGS. 17 and 4, next, contact holes h9 are formed. Then, on the insulating layer 18, contact electrodes CA2 and connecting electrodes CN1 are formed. As described above, the contact electrodes CA2 may not necessarily cover the entire contact holes h9, respectively. Here, in the preparation of the contact electrodes CA2, ITO of the contact electrodes CA1 is crystallized, and therefore the loss of the contact electrodes CA1, which may be caused by an etchant for the second transparent conductive layer TE2 including the contact electrodes CA2, can be avoided. After that, on the insulating layer 18, the contact electrodes CA2 and the connecting electrodes CN1, an insulating layer 19 is formed.

Figure 18:
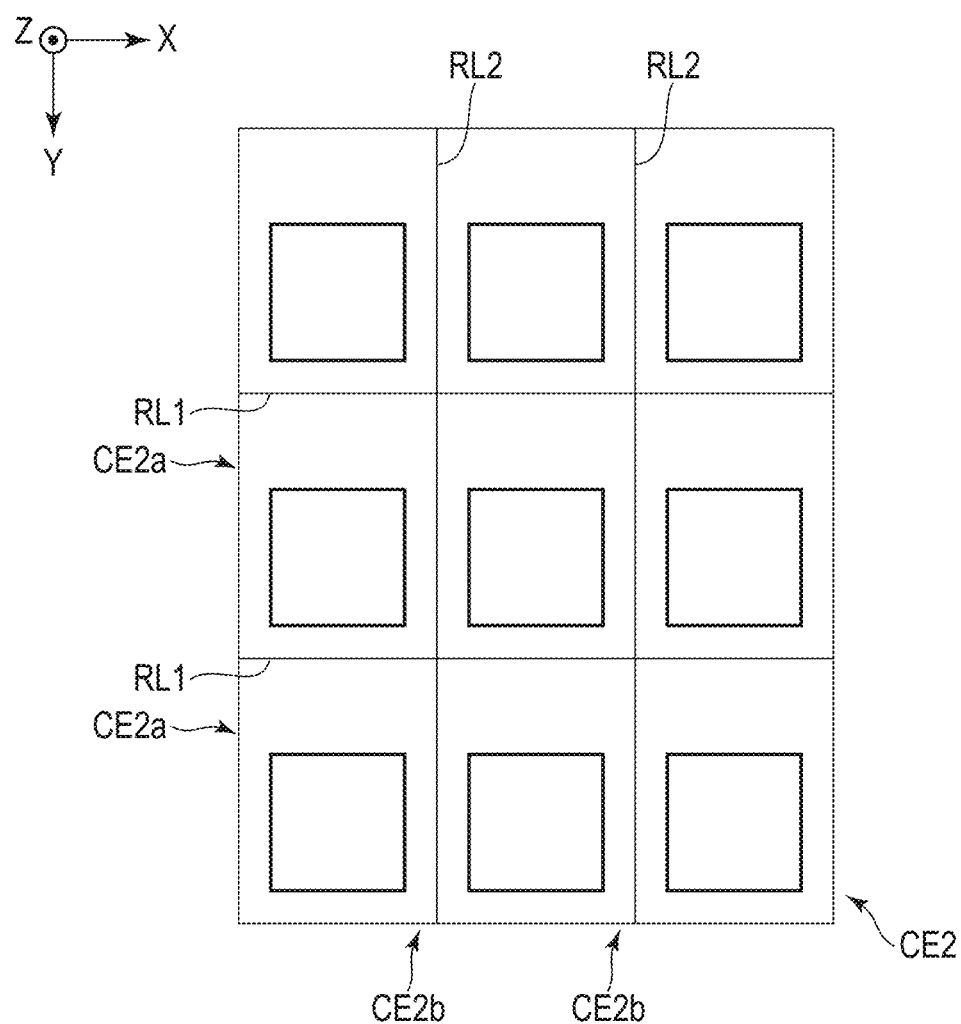
FIG. 18 is a plan view illustrating a step following that shown in FIG. 17 in the manufacturing method, also showing the second common electrode.

As shown in FIGS. 18 and 4, subsequently, a second common electrode CE2 is formed on the insulating layer 19.

Figure 19:
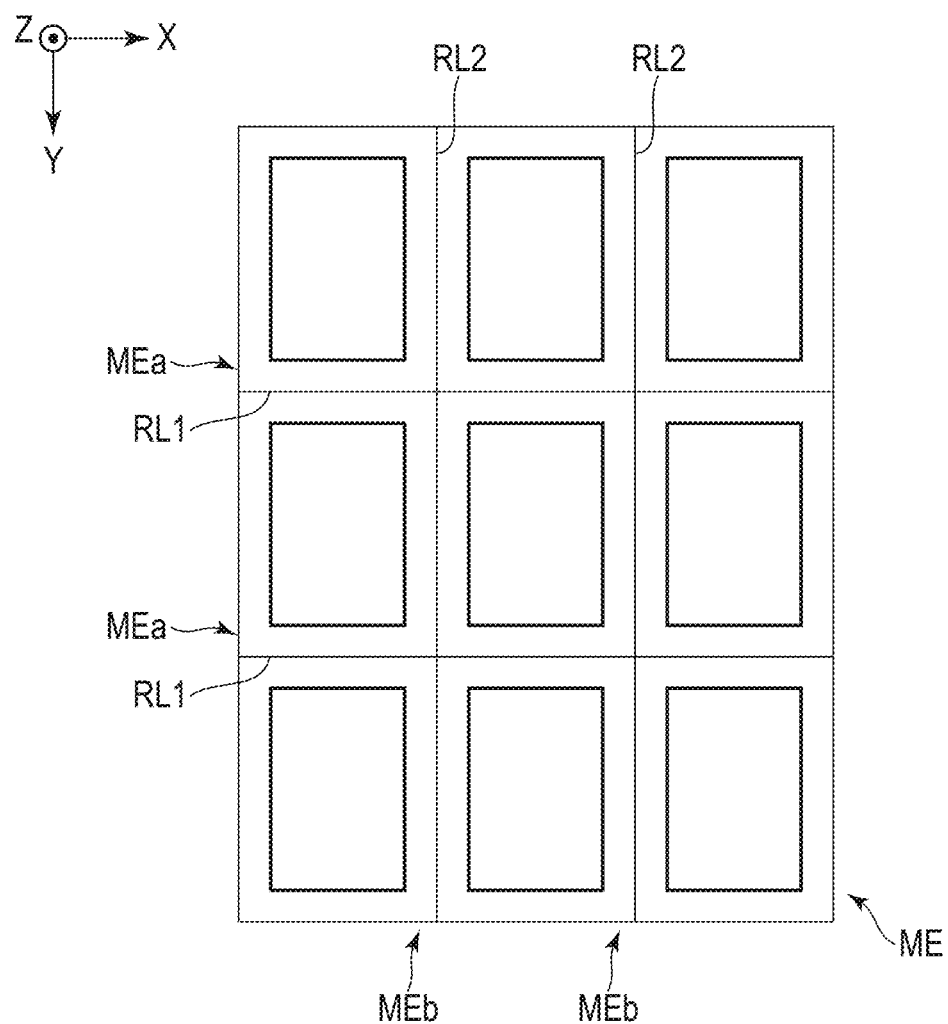
FIG. 19 is a plan view illustrating a step following that shown in FIG. 18 in the manufacturing method, also showing the metal layer.

As shown in FIGS. 19 and 4, next, on the second common electrode CE2, a metal layer ME is formed. Then, on the insulating layer 19, the second common electrode CE2 and the metal layer ME, an insulating layer 20 is formed.

Figure 20:
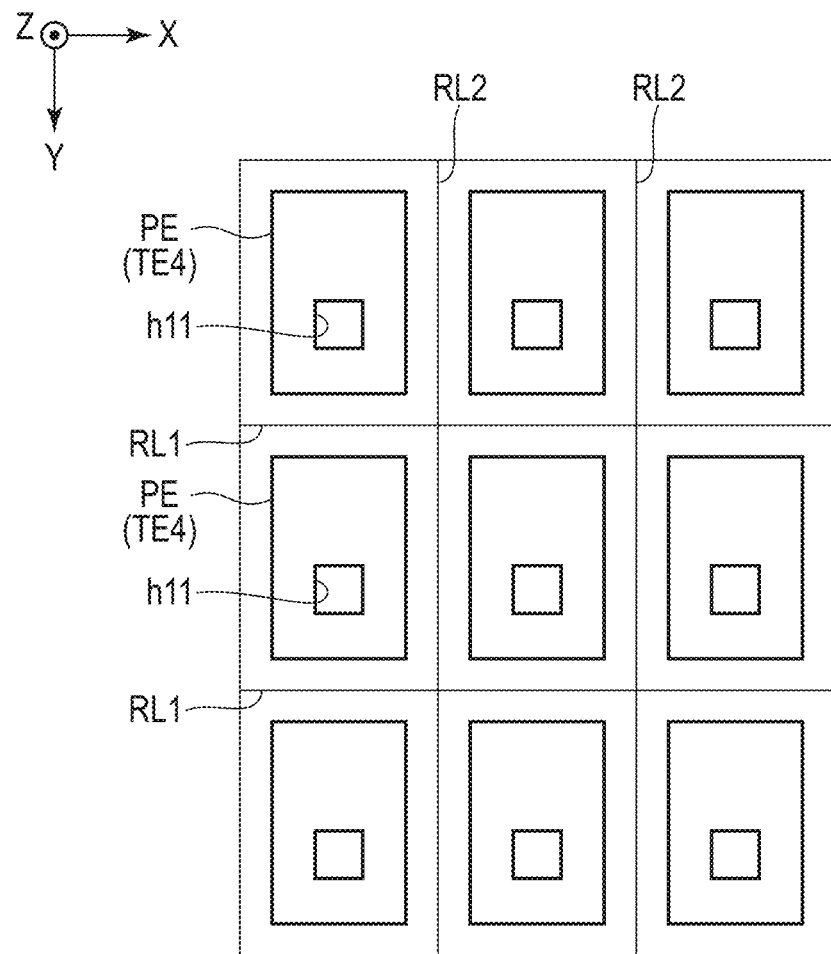
FIG. 20 is a plan view illustrating a step following that shown in FIG. 19 in the manufacturing method, also showing a plurality of pixel electrodes and contact holes.

As shown in FIGS. 20 and 4, subsequently, contact holes h11, h12 and h13 are formed at the same time. Then, on the insulating layer 20, pixel electrodes PE and connecting electrodes CN2 are formed at the same time.

After that, on the insulating layer 20, the pixel electrodes PE and the connecting electrodes CN2, an insulating layer 21, a first common electrode CE1, a spacer 28 and an alignment film 29 are formed in order. Thus, the manufacture of the array substrate AR is finished.

According to the liquid crystal display device DSP of this embodiment configured as above, the array substrate AR comprises a plurality of transparent conductive layers TE stack one on another while opposing each other. For example, the array substrate AR comprises the common electrodes CE1 and CE2 overlapping the pixel electrodes PE. With this structure, the storage capacitor CS can be secured without expanding the pixel electrodes PE in plan view. Therefore, a high-definition liquid crystal display device DSP can be obtained.

Further, the channel region RC1 of the semiconductor layer SC1 is bent in a region overlapping the gate electrodes GE1. With this structure, a high-definition liquid crystal display device DSP can be obtained.

Furthermore, in a high-definition (super high-definition) liquid crystal display device DSP, the aperture ratio can be improved as much as possible, and also a design margin can be secured. For example, by forming the contact electrode CA1 located in the open areas OA from a transparent conductive material, the aperture ratio can be improved. The liquid crystal display device DSP is applicable to, for example, a virtual reality (VR) usage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the above-described embodiments are also applicable to liquid crystal display devices other than the liquid crystal display device DSP described above or display devices other than the liquid crystal display devices.

Further, the above-described embodiments can be applied not only to display devices, but also semiconductor devices comprising a thin film transistor.

What is claimed is:

1. A display device comprising:
   a semiconductor layer including a first region, a second region and a channel region between the first region and the second region;
   a first insulating layer located on the semiconductor layer;
   a gate electrode located on the first insulating layer and opposing the channel region;
   a second insulating layer located on the first insulating layer and the gate electrode; and
   a pixel electrode located above the second insulating layer and electrically connected to the second region;
   a plurality of gates lines extending in the first direction and arranged in the second direction, with intervals therebetween;
   a plurality of source lines extending in the second direction and arranged in the first direction with intervals therebetween, to intersect the plurality of gates lines;
   a first transparent conductive layer provided on the second insulating layer and brought into contact with the second region through a first contact hole formed in the first insulating layer and the second insulating layer;
   a third insulating layer located on the second insulating layer and the first transparent conductive layer; and
   a second transparent conductive layer provided on the third insulating layer and brought into contact with the first transparent conductive layer through a second contact hole formed in the third insulating layer,
   the channel region being bent in a region overlapping the gate electrode,
   the channel region including a first portion extending in a first direction and a second portion extending in a second direction intersecting the first direction,
   the second direction being not parallel to the first direction,
   the first portion and the second portion overlapping the gate electrode,
   the gate electrode being electrically connected to one of the plurality of gate lines and being located in a region where a respective one of the plurality of gate lines and a respective one of the plurality of source lines overlap,
   the channel region being bent in a region where a respective one of the plurality of gate lines and a respective one of the plurality of source lines overlap each other,
   the first transparent conductive layer being located in an open area surrounded by a respective adjacent pair of gate lines of the plurality of gate lines and a respective adjacent pair of source lines of the plurality of source lines,
   the pixel electrode being electrically connected to the second region via the first transparent conductive layer and the second transparent conductive layer,
   the third insulating layer including a colored layer comprising a first flat surface on a side opposing the second transparent conductive layer, and an organic insulating layer located between the colored layer and the second transparent conductive layer and comprising a second flat surface brought into contact with the second transparent conductive layer,
   in a direction parallel to the second flat surface, a second minimum distance from a central axis of the second contact hole to the second flat surface being less than a first minimum distance from the central axis of the second contact hole to the first flat surface.

2. The device of claim 1, wherein
   the second region is located in the open area together with the first transparent conductive layer, and
   the semiconductor layer is formed of an oxide semiconductor.

3. The device of claim 1, further comprising:
   a first substrate;
   a second substrate disposed to oppose the first substrate with a gap therebetween; and
   a liquid crystal layer held between the first substrate and the second substrate,
   wherein
   the first substrate includes the semiconductor layer, the first insulating layer, the gate electrode, the second insulating layer and the pixel electrode.

* * * * *